(12) United States Patent
Song et al.

(10) Patent No.: US 11,581,500 B2
(45) Date of Patent: Feb. 14, 2023

(54) MOBILE TERMINAL INCLUDING CURVED EDGE SUPPORT PLATE

(71) Applicant: LG ELECTRONICS INC., Seoul (KR)

(72) Inventors: Insu Song, Seoul (KR); Kyungsoo Son, Seoul (KR); Jihoon Lee, Seoul (KR); Kiseong Mun, Seoul (KR); Jaewook Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 101 days.

(21) Appl. No.: 17/147,397

(22) Filed: Jan. 12, 2021

(65) Prior Publication Data

US 2022/0037600 A1    Feb. 3, 2022

(30) Foreign Application Priority Data

Jul. 29, 2020  (WO) ................ PCT/KR2020/009969

(51) Int. Cl.
*H01L 51/00*    (2006.01)
*H01L 51/52*    (2006.01)
(Continued)

(52) U.S. Cl.
CPC ...... *H01L 51/0097* (2013.01); *H01L 27/3244* (2013.01); *H01L 51/5237* (2013.01);
(Continued)

(58) Field of Classification Search
CPC ............. H01L 51/0097; H01L 51/5237; H01L 51/5253; H01L 51/5281; H01L 51/5293;
(Continued)

(56) References Cited

U.S. PATENT DOCUMENTS 9,276,055 B1 *  3/2016  Son .................... H01L 27/1225
9,985,208 B2 *  5/2018  Hwang ................. H01L 24/75
(Continued)

FOREIGN PATENT DOCUMENTS

CN   110572497   12/2019
EP   2993872    3/2016
(Continued)

OTHER PUBLICATIONS

PCT International Application No. PCT/KR2020/009969, International Search Report dated Apr. 28, 2021, 11 pages.
(Continued)

*Primary Examiner* — Ida M Soward
(74) *Attorney, Agent, or Firm* — Lee, Hong, Degerman, Kang & Waimey PC

(57) ABSTRACT

A mobile terminal according to an embodiment includes a display panel having flexibility, and a support plate configured to support the display panel and to include a curved edge, at least a part of which is surrounded by the display panel. The display panel includes a base substrate, a light-emitting layer provided on the base substrate and configured to include a light-emitting element, a thin-film encapsulation layer configured to seal the light-emitting element, and a thin-film transistor (TFT) film configured to supply a signal to the light-emitting element, a polarizing film provided on the light-emitting layer, and a protective film provided on the polarizing film. The TFT film is extended from the base substrate at the curved edge to cover an edge of the base substrate.

15 Claims, 25 Drawing Sheets

(51) Int. Cl.
  *H01L 27/14* (2006.01)
  *H01L 27/32* (2006.01)
  *G06F 1/16* (2006.01)
  *G09F 9/30* (2006.01)
  *H01L 27/146* (2006.01)
  *G02F 1/1335* (2006.01)

(52) U.S. Cl.
  CPC ...... *H01L 51/5253* (2013.01); *H01L 51/5281* (2013.01); *G02F 1/133528* (2013.01); *H01L 27/14678* (2013.01); *H01L 27/323* (2013.01); *H01L 51/5246* (2013.01); *H01L 51/5293* (2013.01); *H01L 2251/301* (2013.01); *H01L 2251/5338* (2013.01)

(58) Field of Classification Search
  CPC ......... H01L 51/5246; H01L 2251/5338; H01L 2251/301; H01L 27/3244; H01L 27/323; H01L 27/14678; G02F 1/122528; G06F 1/1652; G06F 1/1681; G06F 1/1624; G06F 1/1641; G09F 9/301; H04M 1/0237; H04M 1/0267
  See application file for complete search history.

(56) References Cited

U.S. PATENT DOCUMENTS

| | | | | |
|---|---|---|---|---|
| 2015/0382446 | A1* | 12/2015 | Kwon | H05K 1/147 174/251 |
| 2016/0093683 | A1* | 3/2016 | Lee | G06F 1/1641 257/40 |
| 2018/0101253 | A1 | 4/2018 | He et al. | |
| 2020/0119290 | A1* | 4/2020 | Shin | H01L 51/5237 |
| 2020/0119305 | A1* | 4/2020 | Kwon | H01L 51/0097 |
| 2020/0159358 | A1* | 5/2020 | Hong | G06F 3/044 |
| 2020/0168157 | A1* | 5/2020 | Kim | G09G 3/3258 |
| 2020/0196452 | A1* | 6/2020 | Lee | H05K 1/189 |
| 2020/0203672 | A1* | 6/2020 | Kuon | G06F 1/1652 |
| 2020/0221587 | A1 | 7/2020 | An | |
| 2020/0274104 | A1* | 8/2020 | Park | H01L 51/5246 |
| 2020/0328382 | A1* | 10/2020 | Lee | H01L 51/5268 |
| 2021/0208444 | A1* | 7/2021 | Oka | G02F 1/1339 |

FOREIGN PATENT DOCUMENTS

| | | |
|---|---|---|
| JP | 2015226204 | 12/2015 |
| KR | 1020180015003 | 2/2018 |
| KR | 1020180138252 | 12/2018 |
| KR | 1020190112535 | 10/2019 |
| KR | 1020200013821 | 2/2020 |

OTHER PUBLICATIONS

European Patent Office Application Serial No. 21151137.3, Search Report dated Jul. 13, 2021, 19 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

MOBILE TERMINAL INCLUDING CURVED EDGE SUPPORT PLATE

CROSS REFERENCE TO RELATED APPLICATION(S)

Pursuant to 35 U.S.C. § 119 (a), this application claims the benefit of an earlier filing date and right of priority to International Application No. PCT/KR2020/009969 filed on Jul. 29, 2020, the contents of which are hereby incorporated by reference herein in its entirety.

BACKGROUND OF THE DISCLOSURE

Field of the Disclosure

The present disclosure relates to a mobile terminal. Specifically, the present disclosure is applicable to a technical field of preventing a display panel from being lifted at a curved edge of the mobile terminal.

Discussion of the Related Art

Terminals may be generally classified as mobile/portable terminals or stationary terminals according to their mobility. Mobile terminals may also be classified as handheld terminals or vehicle mounted terminals according to whether or not a user may directly carry the terminal.

A mobile terminal is a device having a function of receiving, processing, and displaying a video that a user may watch. For example, the mobile terminal receives a broadcast selected by the user from broadcast signals transmitted from a broadcasting station, separates a video signal from the received signals, and displays the separated video signal on a display.

A form factor of a mobile terminal has been diversified. Foldable mobile terminals have recently been released starting from flip-type or bar-type mobile terminals having a basic structure and demand for rollable mobile terminals capable of expanding and contracting a screen has also increased. The foldable mobile terminal and the rollable mobile terminal have a structure in which a display panel should be folded or rolled and uses a display panel having flexibility. The display panel uses a protective film having a flexible material instead of a hard material in order to secure flexibility thereof. However, the protective film having flexibility is problematic in that the protective film is lifted at a curved edge because the shape of the protective film is not fixed.

SUMMARY OF THE DISCLOSURE

Accordingly, the present disclosure is directed to a mobile terminal that substantially obviates one or more problems due to limitations and disadvantages of the related art.

An object of the present disclosure is to provide a mobile terminal to prevent a display panel having flexibility from being lifted due to elasticity of the display panel at a region surrounding a curved edge.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a mobile terminal includes a display panel having flexibility, and a support plate configured to support the display panel and to include a curved edge, at least a part of which is surrounded by the display panel. The display panel includes a base substrate, a light-emitting layer provided on the base substrate and configured to include a light-emitting element, a thin-film encapsulation layer configured to seal the light-emitting element, and a thin-film transistor (TFT) film configured to supply a signal to the light-emitting element, a polarizing film provided on the light-emitting layer, and a protective film provided on the polarizing film. The TFT film is extended from the base substrate at the curved edge to cover an edge of the base substrate.

In accordance with an embodiment, the TFT film may be extended from a front face of the curved edge to a rear face of the curved edge to surround the curved edge.

In accordance with an embodiment, the protective film may be extended in a curvature direction of the curved edge to cover an edge of the polarizing film.

In accordance with an embodiment, the protective film may be extended in the curvature direction of the curved edge to cover an edge of the TFT film.

In accordance with an embodiment, the protective film may be provided by stacking a colorless polyimide (CPI) film, a polyethylene terephthalate (PET) film, and a hard coating (HC) film.

In accordance with an embodiment, the protective film may be extended in the curvature direction of the curved edge to cause the PET film and the HC film to cover the edge of the polarizing film.

In accordance with an embodiment, the protective film may further include an anti-fingerprint (AF) film stacked along an upper face of the extended HC film.

In accordance with an embodiment, the mobile terminal may further include a main frame having a front face at which the support plate is located, a side frame configured to surround a side face of the main frame and contact the curved edge of the support plate. The protective film may have an extended end portion between the support plate and the side frame.

In accordance with an embodiment, the protective film may have the extended end portion between the support plate and the main frame.

In accordance with an embodiment, the protective film may be formed by stacking a first hard coating (HC) film, a ultra-thin glass (UTG), and a second HC film.

In another aspect of the present disclosure, a mobile terminal includes a first frame, a second frame configured to slidably move in a first direction or in a second direction corresponding to a reverse direction of the first direction from the first frame, a driving unit configured to cause the second frame to slidably move, a display panel having flexibility configured to surround a front face of the first frame and the slidably moving second frame, and a support plate provided on the front face of the first frame and configured to support the display panel and to include a curved edge, at least a part of which is surrounded by the display panel. The display panel includes a base substrate, a light-emitting layer provided on the base substrate and configured to include a light-emitting element, a thin-film encapsulation layer configured to seal the light-emitting element, and a thin-film transistor (TFT) film configured to supply a signal to the light-emitting element, a polarizing film provided on the light-emitting layer, and a protective film provided on the polarizing film. The TFT film is extended from the base substrate at the curved edge to cover an edge of the base substrate.

In accordance with another embodiment, the support plate may include the curved edge at an end portion of the second direction.

In accordance with another embodiment, the TFT film may be extended from a front face of the curved edge to a rear face of the curved edge to surround the curved edge and may be coupled to an electronic control unit provided inside the first frame.

In accordance with another embodiment, the protective film may be extended in a curvature direction of the curved edge to cover an edge of the polarizing film.

In accordance with another embodiment, the first frame may further include a side frame configured to contact the curved edge of the support plate and form a side face outer appearance, and the protective film may have an extended end portion between the support plate and the side frame.

Additional range of applicability of the present disclosure will be apparent from the detailed description given below. However, it will be appreciated by those skilled in the art that various changes and modifications may be made thereto without departing from the scope and spirit of the present disclosure, and it should be also appreciated that the above-described embodiments are given merely as an example.

DETAILED DESCRIPTION OF THE DISCLOSURE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element may be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
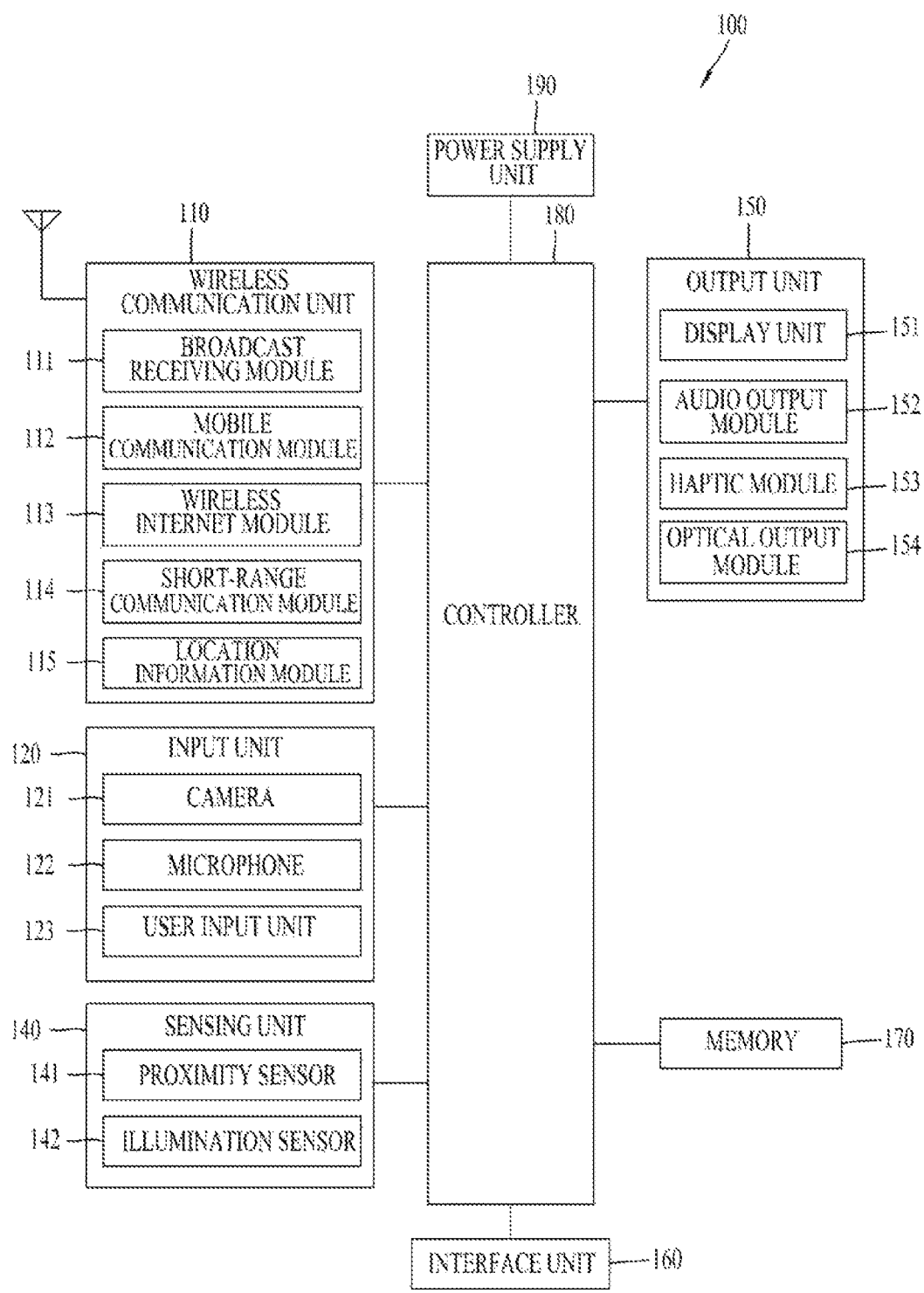
FIG. 1 is a block diagram of a mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1A, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 may transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA(High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include Bluetooth™, Radio Frequency Identification (RFID), Infrared Data Association (IrDA), Ultra-WideBand (UWB), ZigBee, Near Field Communication (NFC), Wireless-Fidelity (Wi-Fi), Wi-Fi Direct, Wireless USB(Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal may be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

Such cameras 121 may process image frames of still pictures or video obtained by image sensors in a video or image capture mode. The processed image frames may be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input may be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 may provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 may be configured to generate various tactile effects that a user feels, perceive, or otherwise experience. A typical example of a tactile effect generated by the haptic module 153 is vibration. The strength, pattern and the like of the vibration generated by the haptic module 153 may be controlled by user selection or setting by the controller. For example, the haptic module 153 may output different vibrations in a combining manner or a sequential manner.

An optical output module 154 may output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that may be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Figure 2:
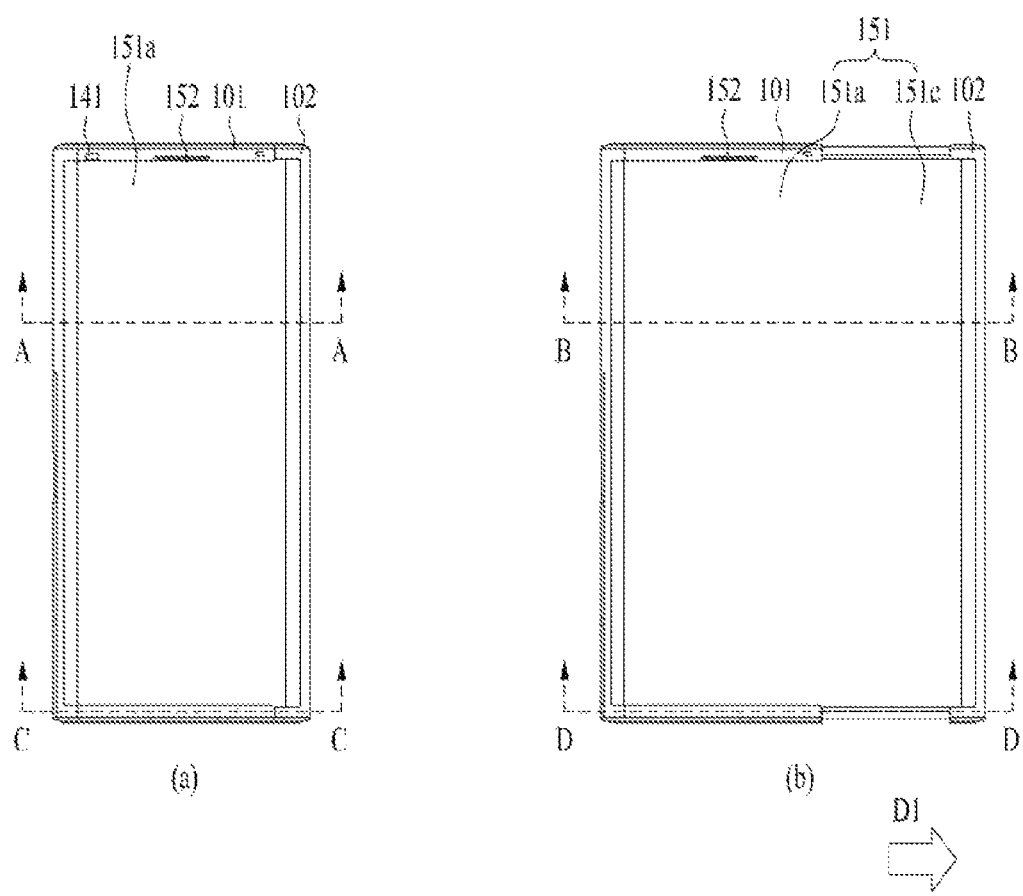
FIG. 2 is a front view of a first state and a second state of the mobile terminal in accordance with an embodiment.
Figure 3:
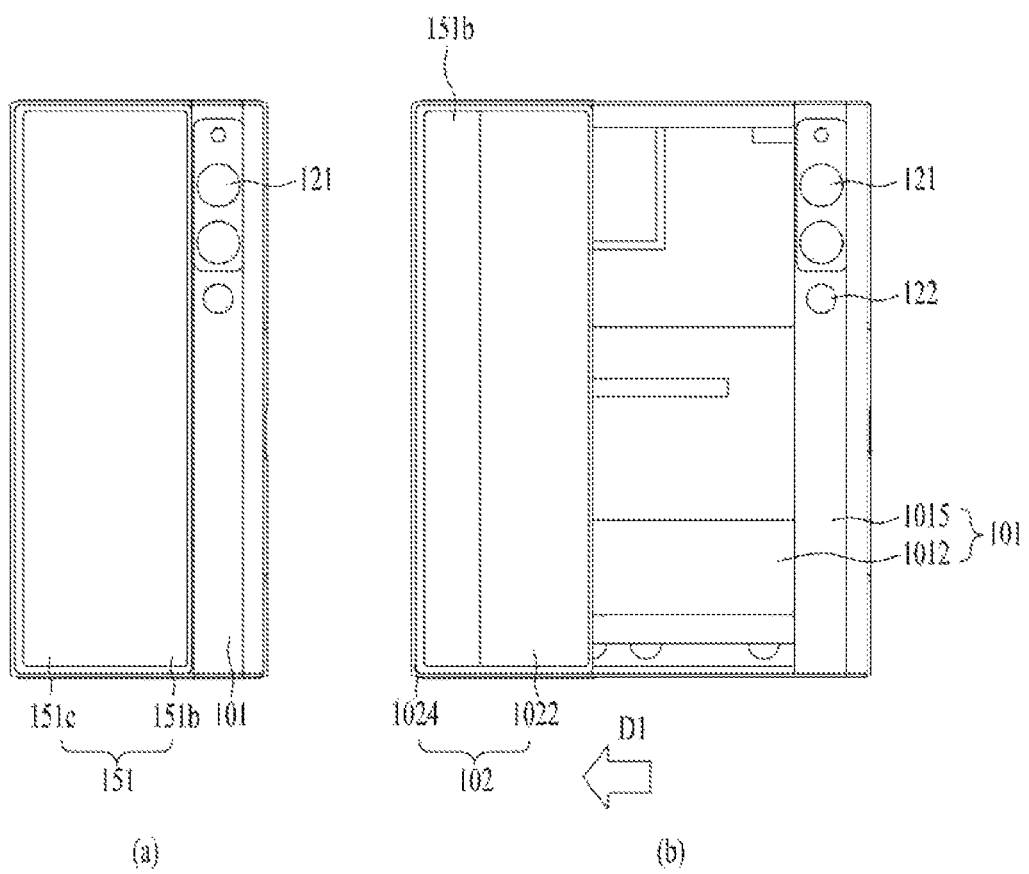
FIG. 3 is a rear view of the first state and the second state of the mobile terminal in accordance with an embodiment.

FIG. 2 is a front view of a first state and a second state of the mobile terminal in accordance with an embodiment, and FIG. 3 is a rear view of the first state and the second state of the mobile terminal in accordance with an embodiment. FIGS. 2(a) and 3(a) are views showing the first state in which the mobile terminal is contracted, and FIGS. 2(b) and 3(b) are views showing the second state in which the mobile terminal is extended.

As shown in the figures, the mobile terminal 100 in the first state is in a contracted position, and has a smaller size than the mobile terminal 100 in the second state. In addition, the size of the display unit 151 positioned on the front of the mobile terminal 100 is also smaller than in the second state. The mobile terminal 100 in the first state may be extended in a first direction D1 to switch to the second state. In the second state, as shown in FIG. 2(b), the size of the mobile terminal 100 and the size of the display unit 151 positioned on the front of the mobile terminal 100 are larger than in the first state, while the size of the display unit 151 positioned on the rear of the mobile terminal 100 is reduced as shown in FIG. 3(b). That is, a part of the display units 151 positioned on the rear of the mobile terminal 151 in the first state moves to the front of the mobile terminal 100 in the second state.

In the following description, the direction in which the mobile terminal 100 and the display unit 151 thereof are extended or enlarged is defined as a first direction D1, and the direction in which the mobile terminal contracts or retracts or is reduced to switch from the second state to the first state is defined as a second direction D2. A direction perpendicular to the first and second directions D1 and D2 is defined as a third direction. Description will be made on the assumption that the first and second directions are horizontal directions and the third direction is a vertical direction. However, depending on the arrangement of the mobile terminal 100, the first and second directions may be vertical directions and the third direction may be a horizontal direction.

As such, a flexible display unit 151 which is bendable may be used as the display unit such that the position of the display unit may be varied. The flexible display unit 151 may be a display unit capable of maintaining a flat state like a conventional flat panel display and capable of warping, bending, folding, twisting, or rolling like paper. The flexible display unit 151 refers to a display which is manufactured on a thin and flexible substrate and is thus lightweight and robust as not to be easily broken. The flexible display unit according the present disclosure may be bent in a specific direction, and may be arranged such that the curvature thereof may change in the first direction.

In addition, electronic paper is a display technology to which properties of general ink are applied. The electronic paper may be different from the conventional flat panel display in using reflected light. The electronic paper may change information using a twisted ball or electrophoresis using a capsule.

In a state in which the flexible display unit 151 is not deformed (e.g., a state of having an infinite curvature radius, hereinafter referred to as a basic state), a display region of the flexible display unit 151 becomes flat. In a state in which the flexible display unit 151 is deformed by an external force from the basic state (e.g., a state of having a finite radius of curvature, hereinafter referred to as a deformed state), the display region may become a curved face. As shown, information displayed in the deformation state may be visual information output on the curved face. Such visual information is implemented by independently controlling light emission of sub-pixels arranged in a matrix. The sub-pixel refers to a minimum unit for implementing one color. When external force is applied to the flexible display unit 151, the flexible display unit 151 may be deformed to switch from the default state, which is the flat state, to a bent state, which is not the flat state.

The flexible display unit 151 may be combined with a touch sensor to implement a flexible touch screen. When a touch is made on the flexible touch screen, the controller 180 (see FIG. 1) may perform control corresponding to such touch input. The flexible touch screen may be configured to detect the touch input in the deformed state as well as in the basic state.

The touch sensor detects the touch (or touch input) applied on the touch screen using at least one of various touch schemes such as a resistive film scheme, a capacitance scheme, an infrared scheme, an ultrasonic wave scheme, a magnetic field scheme, and the like.

As an example, the touch sensor may be configured to convert a change in pressure applied on a specific portion of the touch screen, capacitance generated at the specific portion, or the like into an electrical input signal. The touch sensor may be configured such that a touch object applying a touch on the touch screen may detect touched position and area on the touch sensor, a pressure during the touch, a capacitance during the touch, and the like.

Further, the mobile terminal 100 may have a deformation detection means for detecting the deformation of the flexible display unit 151. Such deformation detection means may be included in the sensing unit 140 (see FIG. 1).

The deformation detection means may be disposed in the flexible display unit 151 or a case (first to second frames 101 to 102 to be described later) to detect information related to the deformation of the flexible display unit 151. In this connection, the information related to the deformation may include a direction in which the flexible display unit 151 is deformed, a degree of the deformation, a deformed position, a deformed time, an acceleration at which the deformed flexible display unit 151 is restored, and the like. In addition, the information related to the deformation may include various kinds of information that may be detected due to the bending of the flexible display unit 151.

In addition, the controller 180 may change information displayed on the flexible display unit 151 or generate a control signal for controlling a function of the mobile terminal 100 based on the information related to the deformation of the flexible display unit 151 detected by the deformation detection means.

The deformation of the flexible display unit 151 may vary depending on the positions of the first frame 101 and the second frame 102. As shown in FIG. 2, since the bending position on the flexible display unit 151 is determined according to the positions of the first frame and the second frame, the bending deformation position of the flexible display unit 151 and the area thereof positioned on the front may be calculated based on the positions of the first frame 101 and the second frame 102 in place of the deformation detection means of the flexible display unit 151.

The state conversion (first or second state) of the flexible display unit 151, i.e., the size change at the front and rear faces of the mobile terminal 100 of the display unit 151 based on the size change of the mobile terminal 100 may be performed manually by a force applied by the user, but may be not limited to such manual scheme. For example, when the mobile terminal 100 or the flexible display unit 151 is in the first state, the mobile terminal 100 or the flexible display unit 151 may be converted into the second state by the user or an application command without the external force applied by the user. As such, in order for the flexible display unit 151 to be automatically deformed without the external force, the mobile terminal 100 may include a driving unit 200, which will be described later.

The flexible display unit 151 of the present disclosure is bent 180 degrees by rolling around a side portion of the mobile terminal 100 facing in the first direction. Accordingly, based on the side portion of the mobile terminal 100, a part of the flexible display unit 151 is disposed on the front of the mobile terminal 100, and the other part of the flexible display unit 151 is disposed on the rear of the mobile terminal 100. For simplicity, the part of the flexible display unit 151 positioned on the front is called a front face, and the other part of the flexible display unit 151 positioned on the rear is called a rear face. As illustrated in FIG. 2, the mobile terminal may extend in the first direction or contract in the second direction opposite to the first direction. In this case, the area of the flexible display unit 151 positioned on the front changes. That is, the sizes of the front face and the rear face may be changed according to a change in the state of the mobile terminal.

The part of the flexible display unit 151 positioned on the front of the mobile terminal 100 may be immovably fixed to the front surface of the first frame 101, and the other part thereof positioned on the rear of the mobile terminal 100 may be movably arranged on the rear of the mobile terminal 100.

In addition, the flexible display unit 151 may be rolled on or released at the side portion in the first direction of mobile terminal. Accordingly, the rear face of the display unit 151 moves, so that the size of the front face of the display unit 151 may be adjusted. Since the size of the flexible display unit 151 is determined and the flexible display unit 151 is formed of one continuous body, an area of the rear face of the display unit 151 decreases as an area of the front face of the display unit 151 increases. Such a display unit 151 may be rolled in a second frame 102, which is movable relative to a first frame 101 to be described later, more correctly, on one of sides of the second frame 102. The display unit 151 may be withdrawn or pulled out from or inserted or pushed into the second frame 102 while being rolled in the second frame 102 along a moving direction of the second frame 102 to adjust the area of the display unit 151 on the front face of the mobile terminal 100. Such operation will be described in more detail below along with other relevant components of the mobile terminal 100.

Typically, an antenna is disposed in the case or the housing of the mobile terminal 100, but a portion where the antenna is installed in the case or the housing may be limited because of the flexible display unit 151 that covers not only the front face of the mobile terminal 100 but also the rear face thereof. For this reason, the antenna may be implemented on the flexible display unit 151. An antenna on display (AOD) is an antenna in which a transparent film is formed by stacking an electrode layer and a dielectric layer that have patterns engraved thereon, respectively. The antenna on display may be implemented thinner than an antenna implemented using a laser direct structuring (LDS) technology using a conventional copper nickel plating scheme, so that the antenna on display may not be exposed to the outside without affecting a thickness. In addition, the antenna on display may transmit and receive a signal directly to or from the display unit 151. Accordingly, the antenna on display may be used in the mobile terminal 100 in which the display unit 151 is located on the both faces of the mobile terminal 100 as in the present disclosure.

Figure 4:
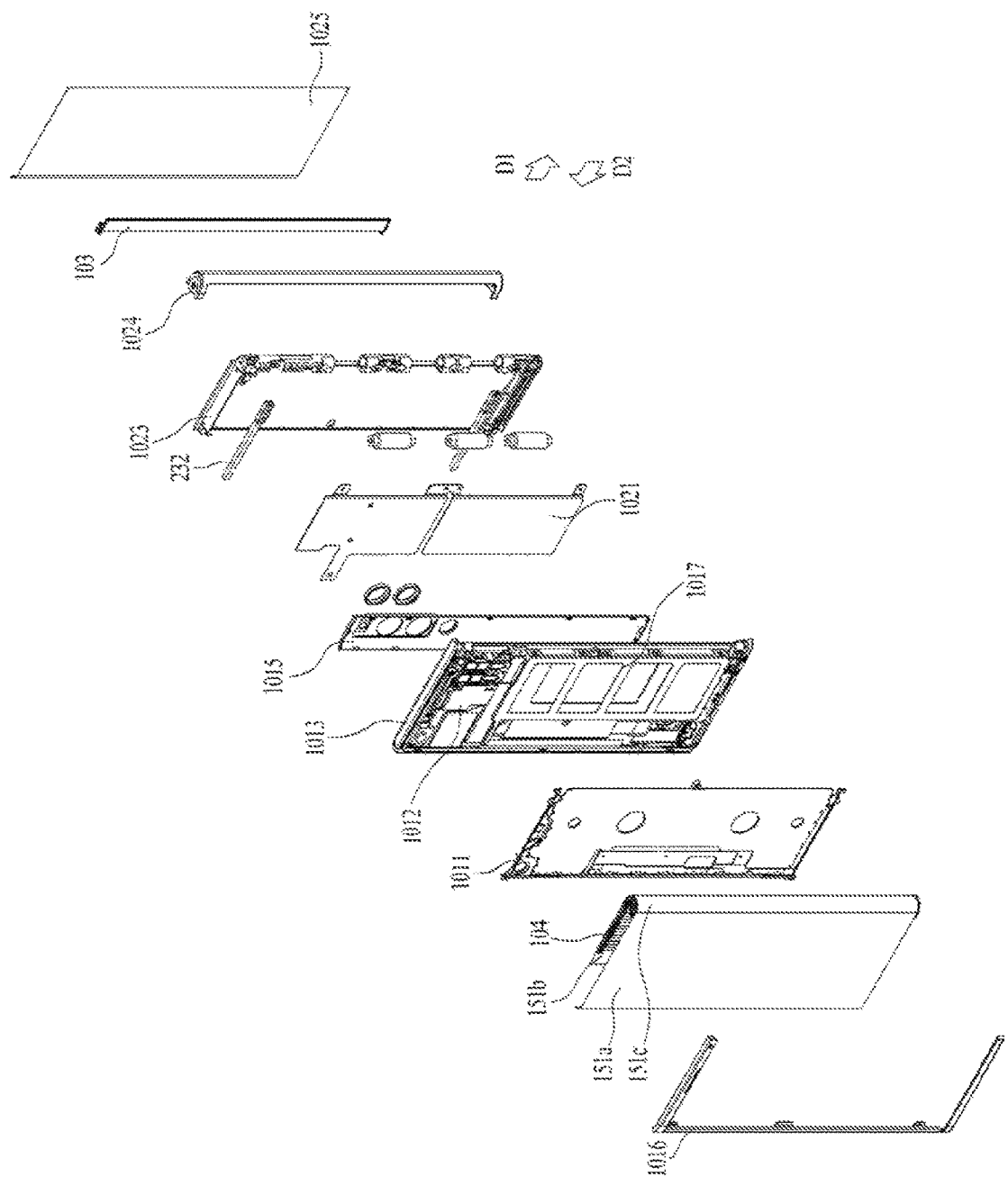
FIGS. 4 and 5 are exploded perspective views of the mobile terminal in accordance with an embodiment.
Figure 5:
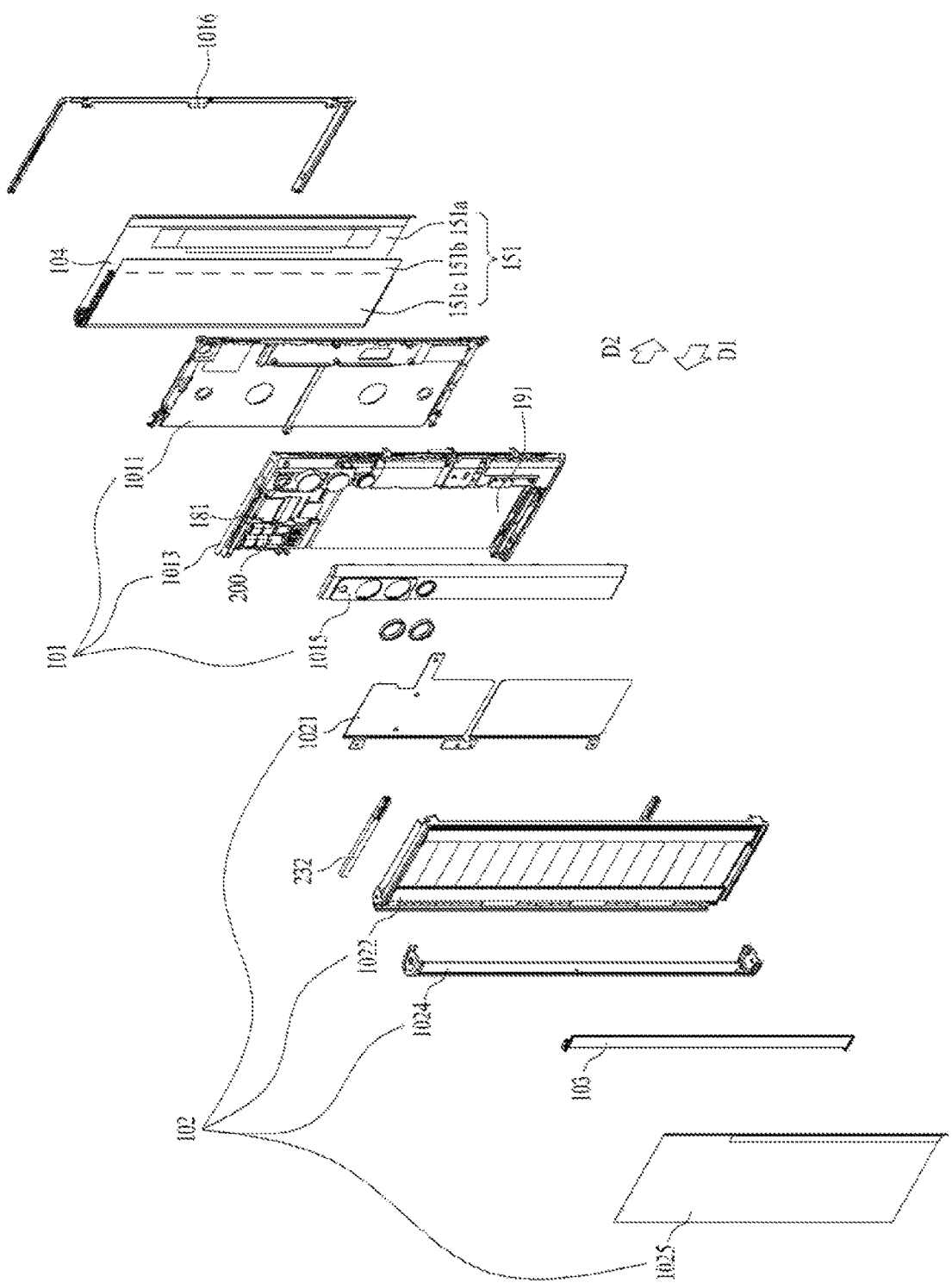

FIGS. 4 and 5 are exploded perspective views of the mobile terminal in accordance with an embodiment. FIG. 4 is an exploded perspective view of the mobile terminal as viewed from the front side, and FIG. 5 is an exploded perspective view of the mobile terminal as viewed from the rear side.

The mobile terminal 100 of the present disclosure includes frames 101 and 102 in which components are mounted, and the frames 101 and 102 of the present disclosure may vary in size in the first direction as shown in FIG. 2. One or more frames 101 and 102 move relative to each other, and sizes thereof may vary in the first direction. Electronic components are mounted in the frames 101 and 102, and the flexible display unit 151 is located out of the frames 101 and 102.

Since the mobile terminal 100 of the present disclosure includes the flexible display unit 151, the flexible display unit 151 may be combined in a form surrounding front faces and rear faces of the frames 101 and 102. The frame may include the first frame 101 and the second frame 102 moving in the first direction with respect to the first frame 101. The first frame 101 and the second frame 102 include front portions, a rear portions, and side portions, respectively, and are coupled to each other.

First, the first frame 101 corresponds to a main body of the mobile terminal 100, and may have a space between the first front portion 1011 and the first rear portion 1012 therein for accommodating various components. In addition, the first frame 101 may accommodate the second frame 102 movably coupled to the first frame 101 in such a space. More specifically, as shown in FIGS. 2 and 5, the first frame 101 may include a first front portion 1011 disposed at a front portion of the mobile terminal 100 and supporting the front face of the display unit 151 and a first rear portion 1012 disposed at a rear portion of the mobile terminal and on which various components are mounted.

The first front portion 1011 and the first rear portion 1012 may be spaced apart from each other at a predetermined spacing to define a predetermined space therebetween, and may be connected to each other by a first side portion 1013. The first side portion 1013 may be integrally formed with the first rear portion 1012 or the first front portion 1011. The camera 121, the audio output module 152, and the input/output terminal 161, the controller 180, and the power supply unit 190 may be accommodated as components of the mobile terminal 100 in the space in the first frame 101. For example, the controller 180 may be a circuit board 181 including a processor and an electronic circuit for controlling the operation of the mobile terminal, and the power supply unit 190 may be a battery 191 and related components. In addition, the driving unit 200 that controls the slide movement of the second frame 102, which will be described later, may also be accommodated in the first frame 101.

As described above, the display unit 151 has the continuous body, and thus, may be disposed on both the front face and the rear face of the mobile terminal 100 while being rolled in the mobile terminal 100. The display unit 151 may include the front face positioned at the front face of the mobile terminal 100, the rear face positioned at the rear face of the mobile terminal 100, and the side face positioned between the front face and the rear face thereof and surrounding the side face of the mobile terminal. The front face and the rear face of the display unit 151 are flat, and the side face of the display unit 151 may form a curved face. The flexible display unit 151 may be damaged when being bent at an angle. Thus, the flexible display unit 151 may be formed to be bent with a predetermined curvature at the side face.

The display unit 151 may be divided into a fixed portion 151a and 151b and a variable portion 151c. The fixed portion 151a and 151b means a portion fixed to the frame. Because of being fixed to the frame, the fixed portion 151a and 151b maintains a constant shape without changing a bending degree. On the other hand, the variable portion 151c means a portion in which a bending angle or a position of the bent portion changes. The variable portion 151c in which the position or bending angle of the bent portion changes requires a structure for supporting a rear face of the variable portion 151c in response to the change.

The fixed portion 151a, 151b is coupled to the first frame of the display unit and is always positioned on the front face of the display unit to form a portion of the front face of the display unit. The variable portion 151c includes a side face located at a side portion of the mobile terminal, and a position of the side face varies depending on the position of the second frame. Based on a side face, an area of a portion disposed on the front face of the display unit and an area of a portion disposed on the rear face of the display unit vary. That is, a portion of the variable portion 151c may be the front face and another portion of the variable portion 151c may be the rear face based on the first and second states. The variable portion 151c is positioned in the first direction with respect to the fixed portion 151a, 151b relative to the mobile terminal, and an end of the variable portion 151c is bent toward the rear face of the mobile terminal and slides on the rear face of the second frame.

The end of the variable portion of the display unit is coupled with a slide frame that guides the variable portion to slide move on the rear face of the second frame, and the slide frame moves in the first direction at the same time as the second frame moves in the first direction. As a result, a moving distance of the slide frame with respect to the first frame is twice as a moving distance of the second frame with respect to the first frame. Further, as shown in FIG. 3, the first rear portion 1012 of the mobile terminal 100 includes an exposed rear portion 1015 that is exposed to the outside without being covered by the display unit 151 even in the first state. The physical input unit 120 for the manipulation of the mobile terminal 100 such as various buttons, switches, the camera 121, and a flash, and the sensing unit 140 such as the proximity sensor 141 or a fingerprint sensor may be arranged on the exposed rear portion 1015. The first rear portion 1012 except for the exposed rear portion 1015 may be covered by the display unit 151 in the first state as shown in FIG. 3(a), and may be exposed rearward in the second state as shown in FIG. 3(b).

In a conventional bar-shaped terminal, a display unit is provided only on a front face of the terminal. Therefore, a main camera is placed on a rear face of the terminal in order for the user to capture an object at an opposite side while looking through the display unit. On the other hand, an additional auxiliary camera is required to be disposed on the front face of the terminal in order for the user to photograph himself or herself while viewing himself or herself through the display unit.

In the mobile terminal 100 of the present disclosure, on the other hand, the display unit 151 is arranged on both the front and rear of the mobile terminal 100. Accordingly, when a user photographs himself, a portion of the display unit 151 positioned on the same surface as the camera 121, that is, the rear face of the display unit 151 may be used. When the user takes a photograph of an object around the user, a portion of the display unit 151 on the side facing away from the camera 121, that is, the front face of the display unit 151 may be used. For this reason, the mobile terminal 100 may take a photograph of the user or an object located around the user using one camera 121. The camera may include a plurality of cameras having different angles of view, such as wide angle, ultra wide angle, and telephoto angle. Not only the camera but also a proximity sensor and an audio output unit may be disposed on the exposed rear portion 1015, and an antenna 116 may be installed on the rear portion 1015. A rear portion 1015 may be used to protect the camera, the sensor, or the like on the exposed rear portion 1015 and not to deteriorate the exterior design. A portion of the rear portion 1015 corresponding to the camera 121 or the sensor 140 may be configured to be transparent, and the other portion thereof may have a predetermined pattern or color in consideration of design aspects without exposing internal parts.

The first side portion 1013 may extend along the edges of the first front portion 1011 and the first rear portion 1012 to surround the circumference of the first frame 101 and may define the appearance of the mobile terminal 100. However, as mentioned above, the second frame 102 is accommodated in and movably coupled to the first frame 101, and therefore a portion of the first frame 101 needs to be open to allow movement of the second frame 102 relative to the first frame 101. As an example, as best shown in FIG. 2, the second frame 102 may be movably coupled to a side of the first frame 101 facing in the first direction, and accordingly the first side portion 1013 may not be formed on the lateral surface facing in the first direction such that the lateral surface is open. Since the first side portion 1013 is exposed to the outside of the mobile terminal 100, the interface unit 160 for connecting a power port or an ear jack or the user input unit 120, such as a volume control button, may be disposed on the first side portion 1013. When the first side portion 1013 contains a metal material, the first side portion 1013 may serve as an antenna.

The second frame 102 may include a second front portion 1021 disposed at the front portion of the mobile terminal 100 and a second rear portion 1022 disposed at the rear portion of the mobile terminal 100. Like the first front portion 1011 and the first rear portion 1012 of the first frame 101, the second front portion 1021 and the second rear portion 1022 may be formed of plate-shaped members that are generally flat. In addition, the second frame 102 also accommodates various components, and must not interfere with the components accommodated in the first frame 101 during the movement. Accordingly, the second front portion 1021 and the second rear portion 1022 may be coupled to each other in a state of being spaced apart from each other to define a predetermined space therebetween, and may have shapes that do not interfere with the components in the first frame 101.

Figure 6:
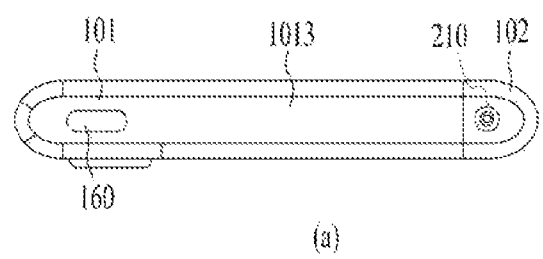
FIG. 6 is a side view of the mobile terminal as viewed from a third direction.
Figure 6:
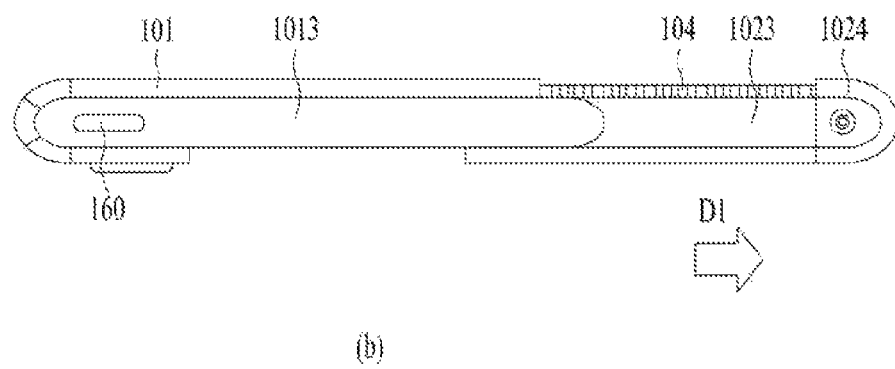

FIG. 6 is a side view of the mobile terminal as viewed from a third direction. FIG. 6 shows the first side portion 1013 of the first frame 101 and a second side portion 1023 of the second frame 102. Since the flexible display unit 151 is positioned at an end of the second frame 102 facing in the first direction, the end of the second frame 102 facing in the first direction should not be exposed to the outside. An end of the second frame 102 facing in the second direction should be open so as not to interfere with the first frame 101. In the first state, the second side portion 1023 of the second frame 102, which is positioned on the side facing in the third direction (which refers to the upward or downward direction in the drawing or may include both the upward and downward directions), may not be exposed to the outside because it overlaps the first side portion 1013 of the first frame. However, in the second state, it may be exposed to the outside because the second frame 102 is drawn out.

In addition, the display unit 151 may be bent 180 degrees while being rolled in the second frame 102 to be disposed on both the front face and the rear face of the mobile terminal 100. For such an arrangement of the display unit 151, the second frame 102 may include a roller 210 rotatably disposed therein. The roller 210 may be disposed at any position inside the second frame 102. However, the display unit 151 should be spread flat on the front face and the rear face of the mobile terminal 100 to provide a good quality screen to the user. Further, for such spread, a proper tension must be provided on the display unit 151. In order to provide the proper tension, the roller 210 may be disposed at a first directional end of the second frame 102. The roller 210 may extend in the third direction, and may be rotatably coupled to the second frame 102.

The display unit 151 may be rolled around the roller 210 while being gently bent with a predetermined curvature. The flexible display unit 151 may include a first face on which a video is output and exposed to the outside and an inner face facing the frame at the opposite side. The roller 210 may be installed to rotate freely in the second frame 102 while being in contact with the inner face of the display unit 151. Accordingly, the roller 210 may actually move the display unit 151 in a lateral direction of the mobile terminal 100, that is, in a direction perpendicular to a longitudinal direction. As will be described later, when the second frame 102 slides, because of the tension applied by the second frame 102, the display unit 151 moves to the front face or the rear face of the mobile terminal 100 in different directions (i.e., the first direction D1 or the second direction D2) relative to the second frame 102. The roller 210 may guide such movement while rotating.

The roller 210 may be disposed adjacent to the end of the second frame 102 that faces in the first direction. A side frame 1024 may be disposed at the end of the second frame 102 facing in the first direction to prevent damage to the display unit 151 rolled around the roller 210.

The side frame 1024 may extend in the longitudinal direction (the third direction) of the second frame 102 to cover the side portion facing in the first direction, thereby protecting the roller 210 and the display unit 151 rolled therearound.

The side frame 1024 may substantially define the appearance of the mobile terminal 100 in cooperation with the first side portion 1013 of the first frame 101.

In addition, the side portion of the second frame 102 that faces in the second direction may be omitted to minimize interference with the components arranged in the first frame 101 during movement.

During the expansion and the contraction in such first and second directions D1 and D2, the second frame 102 may overlap the first frame 101, more precisely, the first front portion 1011 and the first rear portion 1012 thereof so as not to interfere with the first frame 101. More specifically, the display unit 151 may be coupled to and supported by the first front portion 1011 of the first frame 101, as described above. Accordingly, the display unit 151 does not need to be additionally supported by the second front portion 1021 of the second frame 102. Rather, when the second front portion 1021 is interposed between the first front portion 1011 and the display unit 151, the display unit 151 may be deformed or damaged because of friction with the second front portion 1021, which is repeatedly moved. Thus, the second front portion 1021 may be disposed below the first front portion 1011, or may be interposed between two first front portions 1011. The second rear portion 1022 of the second frame 102 may be disposed rearward of the first rear portion 1012 of the first frame 101. That is, the front face of the second rear portion 1022 may face the rear face of the first rear portion 1012. In addition, the rear face of the first rear portion 1012 may be in contact with the front face of the second rear portion 1022 to stably support the movement of the second frame 102. Because of such arrangement, the second rear portion 1022 may be exposed to the outside of the first frame, more precisely, of the first rear portion 1012, and may be coupled to the display unit 151.

In addition, the second frame 102 may extend and contract in the first and second directions D1 and D2 to change the size of the mobile terminal 100, particularly, to extend or contract the front face of the mobile terminal 100. Thus, the display unit 151 must move by such extended or reduced front face size to obtain the intended first and second states. However, when being fixed to the second frame 102, the display unit 151 may not be moved smoothly to be adapted for the front face of the mobile terminal 100 that is extended or contracted. For this reason, the display unit 151 may be movably coupled to the second frame 102.

More specifically, the display unit 151 may include a first region 151a disposed on the front of the mobile terminal 100, a second region 151b coupled to a slide frame 103 positioned on the rear of the mobile terminal 100, and a third region 151c located between the first region 151a and the second region 151b and bent around the roller 210. The third region 151c may move to the front or the rear according to change in the state of the mobile terminal 100.

The slide frame 103 may be formed of a plate-shaped member extending in the longitudinal direction (the third direction) of the mobile terminal 100, and may be coupled to the second rear portion 1022 so as to be movable in the first and second directions D1 and D2.

The first to third regions 151a, 151b, and 151c may be connected to each other, and may form a continuous body of the display unit 151. In addition, as described above, for the movement of the third region 151c toward the front face or the rear face of the mobile terminal 100 depending on the moving direction of the second frame 102, the first region 151a may be fixed so as not to move to the front face of the mobile terminal 100, and the second region 151b may be provided to be movable on the rear face of the mobile terminal. Such configuration of the display unit 151 will be described in more detail below.

The first region 151a may be disposed on the front face of the mobile terminal 100, more specifically, the first frame 101, that is, on the front face of the first front portion 1011. The first region 151a is fixed to the first frame 101, that is, the front face of the first front portion 1011 so as not to be moved during the movement of the second frame 102, and thus, the first region 1511 may always be exposed to the front face of the mobile terminal 100.

The third region 151c may be adjacent to the first region 151a in a direction of the second side edge 151e, and may extend into the second frame 102 and rolled on the roller 210. The third region 151c may consecutively extend out of the second frame 102 again and partially cover the second frame 102, that is, the rear face of the second rear portion 1022. Further, the second frame 102, that is, the second rear portion 1022, is adjacent to the first frame 101, namely the first rear portion 1012 and together forms the rear case of the mobile terminal 100. Accordingly, it may be described that the third region 151c is also disposed on the rear face of the first frame 101.

The second region 151b may be adjacent to the third region 151c and may be disposed on the rear face of the mobile terminal 100, more specifically, on the second frame 102, that is, the rear face of the second rear portion 1022 thereof. The second region 151*b* may be coupled to the slide frame 103 without being directly coupled to the second frame 102.

As a result, the first region 151*a* may be disposed on the front face of the mobile terminal 100 and may be always exposed to the front face regardless of the movement of the second frame 102, and the second region 151*b* may be disposed on the rear face of the mobile terminal 100 and may be always exposed to the rear face regardless of the movement of the second frame 102. In addition, the third region 151*c* may be disposed between the first and second regions 151*a* and 151*b*, and may be selectively placed on the front face or the rear face of the mobile terminal 100 depending on the moving directions D1 and D2 of the second frame 102.

Because of such selective placement of the third region 151*c*, as shown in FIG. 4B, the first rear portion 1012 of the first frame 101 may be exposed to the outside of the mobile terminal 100 because the first rear portion 1012 is covered by the second and third regions 151*b* and 151*c* and the second rear portion 1022 of the display unit 151 in the first state, but, in the second state, the third region 151*c* moves to the front face of the mobile terminal 100 and the second rear portion 1022 also moves in the first direction D1. In addition, the second front portion 1021 of the second frame 102 is hidden by the first front portion 1011 of the first frame 101 in the first state, but, in the second state, moves out of the first frame 101 to support the third region 151*c* of the display unit 151 disposed on the front face of the mobile terminal 100.

In order to prevent the second front portion 1021 from affecting the internal components during the slide movement, a separating plate 1017 may be further disposed rearward of the second front portion 1021 and fastened with the first front portion 1011. The second front portion 1021 may move between the first front portion 1011 and the separating plate 1017 based on the slide movement of the second frame.

However, the third region 151*c* may be rolled on the roller 210 and bent in the second frame 102. When converting from the first state to the second state, the third region 151*c* may extend from the second frame 102 to the front face of the mobile terminal 100 while being rolled on the roller 210 in one direction. On the other hand, when converting from the second state to the first state, the third region 151*c* may be retracted from the front face of the mobile terminal 100 to the second frame 102 while being rolled on the roller 210 in the opposite direction, and at the same time, may return to the rear face of the mobile terminal 100 from the second frame 102.

A specific location of the foldable mobile terminal in a form of being spread like a book is easily damaged because only the specific location is folded repeatedly. On the other hand, the deformed portion of the flexible display unit 151, that is, a portion rolled on the roller 210, may vary based on the first and second states of the mobile terminal 100, that is, the movement of the second frame 102. Accordingly, the mobile terminal 100 of the present disclosure may significantly reduce deformation and fatigue repeatedly applied to a specific portion of the display unit 151, thereby preventing damage to the display unit 151.

Based on the above-described configuration, overall operations of the mobile terminal 100 will be described as follows. As an example, the state conversion may be performed manually by the user, and an operation of the mobile terminal 100 during such manual state conversion will be described. However, operations of the first to third frames 101 to 103 and the display unit 151, which will be described below, may be performed in the same manner when a power source other than a user's force is used, for example, when the driving unit 200 to be described below is applied.

A rear face cover 1025 may be further disposed on a rear face of the second rear portion 1022 such that the rear face of the display unit positioned on the rear face of the mobile terminal 100 is not exposed to the outside. The rear face of the display unit may be used in the first state when the rear face cover 1025 uses a transparent material, and the rear face of the display unit may be covered such that the movement of the slide frame 103 is not exposed when the rear face cover 1025 uses an opaque material. That is, the second region and the third region of the slide frame 103 and the display unit 151 may move in the first direction and in the second direction in a space between the second rear portion 1022 and the rear face cover 1025.

Figure 7:
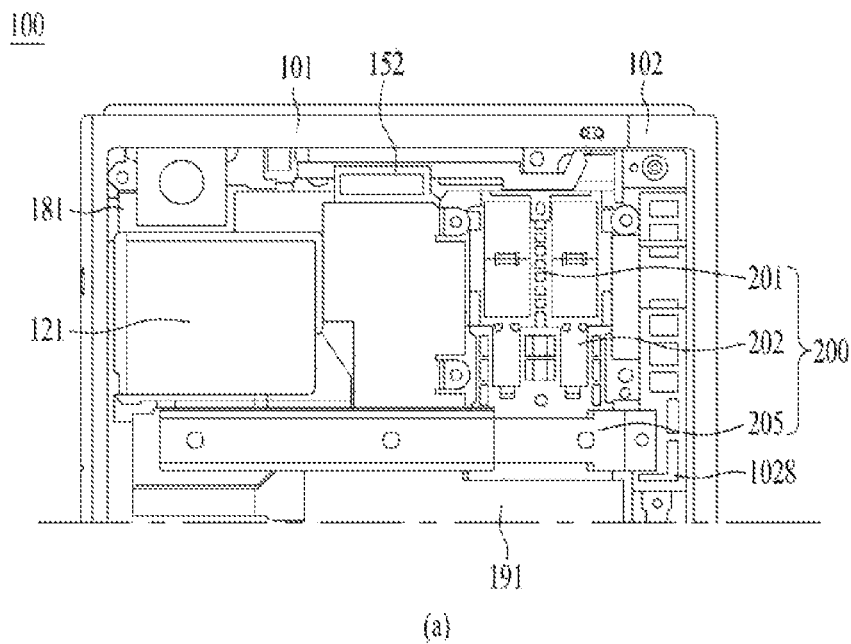
FIG. 7 is a view showing a driving unit of the mobile terminal in accordance with an embodiment.
Figure 7:
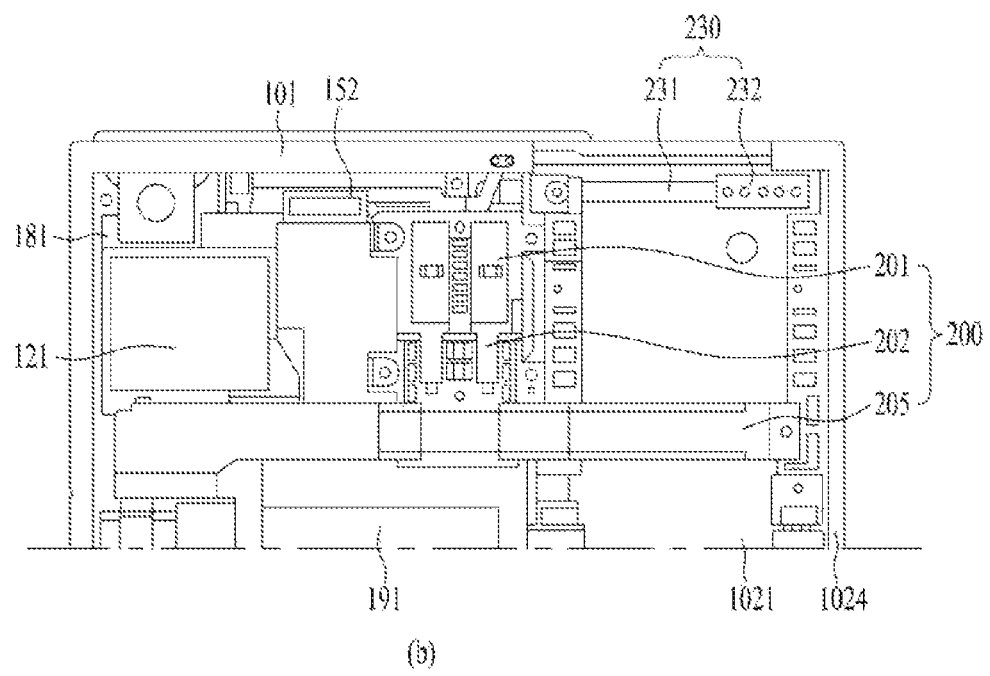

FIG. 7 is a view showing a driving unit 200 of the mobile terminal 100 in accordance with an embodiment. The mobile terminal 100 of the present disclosure may be switched between the states in a manner in which a user manually pulls the second frame 102 in the first direction or pushes the same in the second direction with respect to the first frame 101. However, in the manual method, applying excessive force to the body of the mobile terminal 100 may damage the mobile terminal 100. Accordingly, a driving unit 200 employing a motor 201 may be further provided to allow the second frame 102 to stably move without distortion.

As the motor 201, a motor 201 configured to provide rotational force as shown in FIG. 7, or a linear motor 201 configured to make linear motion may be used. The motor 201 configured to provide the rotational force may need to have a large diameter to provide large force. However, in order to provide driving force of a predetermined magnitude or more in the limited space of the mobile terminal 100 without increasing the thickness, two motors 201 may be used as shown in FIG. 7.

If the second frame 102 is moved excessively fast, damage or malfunction may occur. Accordingly, a planetary gear configured to decrease the speed of the motor 201 to ensure movement at a stable speed may be further provided. The planetary gear 202 serves to amplify or attenuate the number of revolutions of the motor 201 using a plurality of disc gears having different numbers of teeth. The motor 201 may be fixed to the first frame 101 as shown in FIG. 7(*a*). The position of the motor 201 is fixed even when the second frame 102 moves in the first direction to switch the mobile terminal 100 to the second state, as shown in FIG. 7(*b*).

Since the second frame 102 linearly moves with respect to the first frame 101 in the first direction or the second direction, rack and pinion gears configured to convert the rotational force of the motor 201 into linear motion may be used. A pinion gear to receive the rotational force of the motor 201 may be arranged to engage with a rack gear 205 composed of teeth continuously arranged in the first direction. The pinion gear may be fixed to the first frame 101 together with the motor 201 and the rack gear 205 may be positioned on the second frame 102. Alternatively, the rack gear 205 may be positioned on the first frame 101, and the motor 201 and the pinion gear may be arranged on the second frame 102. Since the motor 201 holds the pinion gear such that the pinion gear does not rotate, the second frame 102 may maintain the first state and the second state. However, when large external force is applied, the second frame 102 may be displaced as the pinion gear rotates.

A stopper (not shown) configured to fix the positions of the second frame 102 or the rack gear 205 and the first frame 101 may be further provided to fix the mobile terminal 100 in the first state or the second state. When electric current flows through the motor 201 to drive the motor 201, the stopper may be released to allow the movement of the second frame 102. When power is not applied to the motor 201 and thus the motor 201 does not rotate, the first frame 101 and the second frame 102 may be fastened such that the positions thereof are fixed.

When a pair of driving units 200 is symmetrically disposed in the vertical direction (the third direction), stable movement may be made. However, to arrange a battery or the like, the driving unit 200 should be arranged biased to one side in consideration of the limited mounting space of the mobile terminal 100 as shown in FIG. 7(a). According to such asymmetric arrangement of the driving unit 200, the second frame 102 may be distorted during movement due to a difference in movement speed between the upper end portion and the lower end portion. To address this issue, a linear guide 230 may be further provided.

The linear guide 230 may be disposed at both ends of the mobile terminal 100 facing in the third direction, that is, on the upper and lower sides of the mobile terminal 100, in order to supplement the function of one driving unit 200 biased to one side in the third direction. The linear guide 230 may include a guide rail 231 extending in the first direction and a guide block 232 configured to move along the guide rail 231. The guide rail 231 may be disposed on the first frame 101 and the guide block 232 may be disposed on the second frame 102, or vice versa. In this embodiment, the guide rail 231 may be disposed on the second frame 102 to cover the upper and lower sides of the extended portion of the second frame 102 in the second state.

After the guide block 232 is coupled to the first frame 101 and the guide rail 231 is coupled to the second frame 102, the guide block 232 and the guide rail 231 may be slidably fastened to each other. However, for convenience of the fastening, the guide block 232 and the guide rail 231 fastened to each other. Then, the guide block 232 may be first fixed to the first frame 101, and then the second frame 102 may be coupled to the guide rail 231.

The guide block 232 may be provided with a guide groove into which the guide rail 231 is inserted. Alternatively, the guide rail 231 may be provided with a rail groove into which a portion of the guide block 232 is inserted. The fastening portions of the guide rail 231 and the guide block 232 may be formed to be bumpy. Accordingly, movement in the first direction or the second direction may be made without displacement in the thickness direction of the mobile terminal 100. In order to reduce friction between the guide block 232 and the guide rail 231, a self-lubricating member having high wear resistance and low friction resistance, such as a bearing or polyoxymethylene (POM), may be added to the inside of the guide groove.

Figure 8:
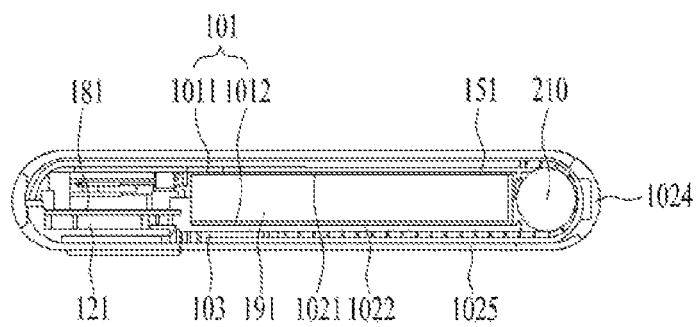
FIG. 8 is a cross-sectional view taken along lines A-A and B-B in FIG. 2.
Figure 8:
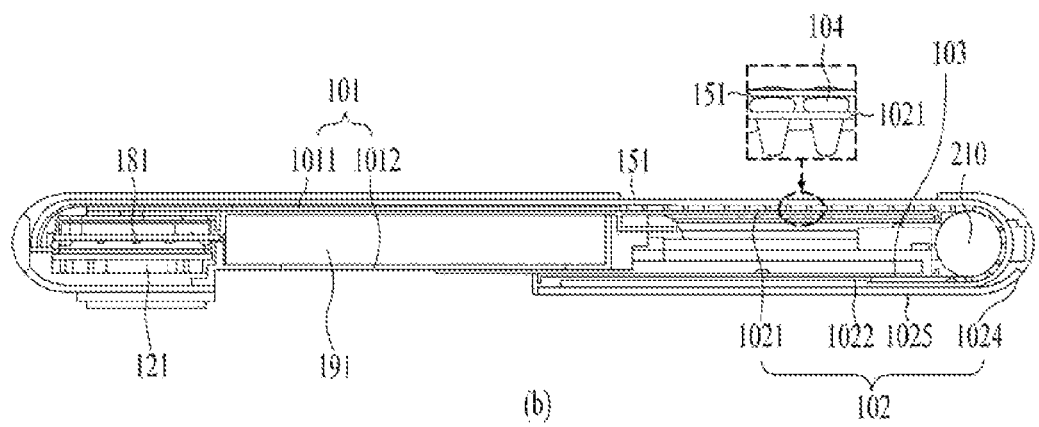

FIG. 8 is a cross-sectional view taken along lines A-A and B-B in FIG. 2. As illustrated in FIG. 2, when the second frame 102 switches to the second state by moving in the first direction, the third region 151c positioned on the rear side moves to the front, and thus a structure to support the rear surface of the third region 151c moved to the front is required. The second front portion 1021 positioned on the front surface of the second frame 102 may be positioned on the rear surface of the third region 151c in the second state. However, in the first state, the second front portion 1021 is disposed to overlap the first front portion 1011 of the first frame 101, and accordingly the first front portion 1011 and the second front portion 1021 form a step. A boundary is formed between the first region 151a and the third region 151c of the flexible display unit 151 by the step formed by the first front portion 1011 and the second front portion 1021. A rolling plate 104 may be used as a support structure to fill the gap between the second front portion 1021 and the third region 151c of the flexible display unit 151.

The rolling plate 104 may be positioned on the rear surface of the flexible display unit 151, and have a thickness corresponding to the gap between the second front portion 1021 and the flexible display unit 151 in the second state. As shown in FIG. 8(a), in the first state, the rolling plate 104 is rolled around the roller 210 and is positioned on the lateral side and rear side of the mobile terminal 100. The flexible display unit 151 and the rolling plate 104 may be positioned between the second rear portion of the second frame 102 and a rear cover 1025 provided to cover the rear face of the display unit 151. As shown in FIG. 8(b), when switch to the second state occurs, the rolling plate 104 may move to the front and the rolling plate 104 may be positioned on the front portion of the second frame 102.

The third region 151c of the display unit 151 in which the rolling plate 104 is positioned is a portion where bending deformation occurs when switch from the first state to the second state occurs. Accordingly, the rolling plate 104 may be deformed according to deformation of the third region 151c. Here, the rolling plate 104 is required to have a predetermined stiffness to maintain the flat state when the flexible display unit 151 is positioned on the front or rear of the mobile terminal. That is, the rolling plate 104 needs a structure capable of maintaining the flat state in the third direction and performing bending deformation in the first direction.

Figure 9:
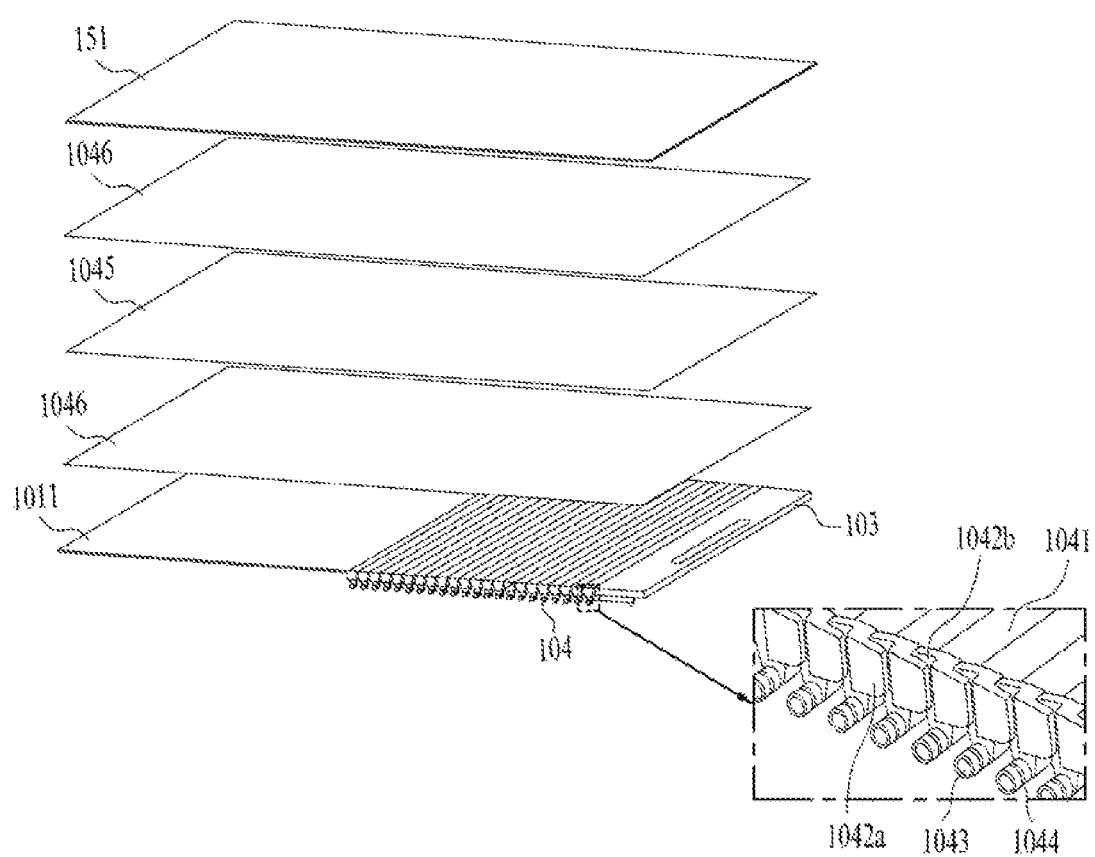
FIG. 9 is a view illustrating a display unit and a rolling plate of the mobile terminal in accordance with an embodiment.

FIG. 9 is a view illustrating a display unit 151 and a rolling plate 104 of the mobile terminal 100 in accordance with an embodiment. The rolling plate 104 may include multiple support bars 1041 extending in the third direction. The multiple support bars 1041 may be arranged side by side in the first direction and spaced apart from each other by a predetermined distance. Accordingly, even when the flexible display unit 151 is rolled around the roller 210 and is thus bent, interference between the support bars 1041 may be avoided. The support bars 1041 may be implemented with an injection molding material having a predetermined thickness for stiffness, and may include a metallic material such as SUS.

The multiple support bars 1041 may be directly attached to the rear surface of the display unit 15. However, this operation may take a long time and produce a lot of defects, resulting in poor productivity. In addition, directly processing the display unit 151 is highly likely to damage the display unit 151. Therefore, a rolling sheet 1045 to fix the multiple support bars 1041 may be further provided. The rolling sheet 1045 may include a metal material, and may employ a superelastic material that is bending-deformable and capable of recovering the flat state after the bending deformation. For example, a superelastic metal sheet such as a thin STS sheet of 0.05 mm or less may be used. An adhesive tape may be attached to both surfaces of the rolling sheet 1045 to bond the rolling sheet 1045 to the support bars 1041 and bond the rear surface of the display unit 151 to the rolling sheet 1045.

The rolling sheet 1045 may be provided with a kerf pattern in which multiple grooves extending in the third direction are formed in the first direction. The grooves in the kerf pattern may be formed between the multiple support bars 1041. The grooves may be formed on a surface of the rolling sheet 1045 to which the support bars 1041 are bonded. The kerf pattern may be formed in a wedge shape so as to be gradually narrowed from the surface portion of the rolling sheet 1045.

Instead of the rolling sheet 1045, an elastic material such as silicone may be disposed between the support bars 1041 to join neighboring support bars 1041. In this case, the angle between the support bars 1041 may be varied. The elastic connector may be bent at a position corresponding to the roller 210. When positioned on the front or rear of the mobile terminal, the elastic connector may be unfolded such that the support bars 1041 are disposed forming a flat surface.

The support bars 1041 may form a flat surface corresponding to the rear surface of the display unit 151. Alternatively, as shown in FIG. 8(*b*), the support bars 1041 may be formed in a shape having a predetermined curvature. The curved support bars 1041 may closely contact the curved surface of the roller 210 when the rolling plate 104 is rolled around the roller 210. Alternatively, one surface of the support bars 1041 in contact with the display unit 151 maintains a flat state, and the other surface thereof on the opposite side may include a curved surface corresponding to the curvature of the roller 210. In this case, the support bars 1041 may be thick at the ends thereof facing in the first and second directions and have the thinnest portion in the middle thereof.

The rolling plate 104 may be disposed at a position corresponding to the third region 151*c* and is rolled and bent around the roller 210. Thus, the rolling plate 104 may span over the front and rear surfaces. The rolling plate 104 is connected to the first front portion 1011 of the first frame 101 on the front side and connected to the slide frame 103 on the rear side. In order for the flexible display unit 151 to form a continuous surface without a step, the first front portion 1011 of the first frame 101 positioned on the rear surface of the first region 151*a*, the slide frame 103 positioned on the rear surface of the second region 151*b*, and the rolling plate 104 positioned on the rear surface of the third region 151*c* may be arranged such that the surfaces thereof in contact with the display unit 151 are at the same height. In particular, since the slide frame 103 moves on the rear of the mobile terminal 100 and moves in the same space as the rolling plate 104, the rolling plate 104 may have a thickness corresponding to the thickness of the slide frame 103.

Figure 10:
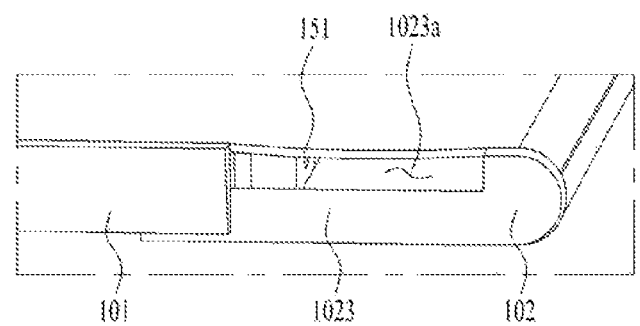
FIG. 10 is a view illustrating an issue raised in an extendable mobile terminal.
Figure 10:
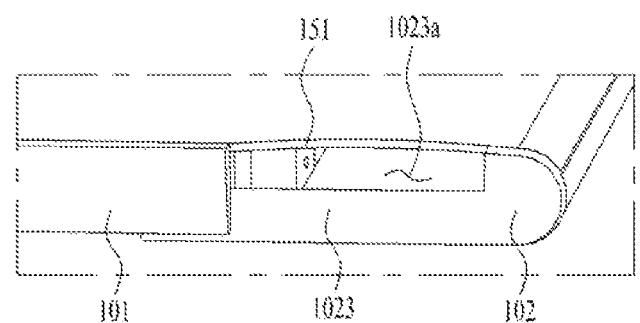

FIG. 10 is a view illustrating an issue raised in an extendable mobile terminal 100. The figure shows the end of the second frame 102 facing in the third direction when the second frame 102 positioned overlapping the first frame 101 is extended as switching from the first state to the second state occurs. Since the display unit 151 contains a flexible material, the display unit 151 may be bent at a position corresponding to the roller 210. However, when the display unit 151 is positioned on the front of the mobile terminal 100 in the second state, it should be maintained in a flat state. Since the rolling plate 104 is not fixed to the second frame 102, the display unit 151 may sag downward as shown in FIG. 10(*a*) or rise upward as shown in FIG. 10(*b*).

The sagging issue of the display unit 151 (in FIG. 10(*a*)) may be addressed when the support bars 1041 of the rolling plate 104 described above support the rear surface of the third region 151*c* of the display unit 151 and the front portion of the second frame 102 supports the support bars 1041. However, in order to address an issue that the display unit 151 moved to the front is not arranged flat but is separated from the second frame 102 as shown in FIG. 10(*b*), the rolling plate 104 and the second frame 102 may further include a slide structure 1043, 1027. The slide structures 1043 and 1027 may fasten the rolling plate 104 (the display unit 151) so as not to be separated from the second frame 102 in the thickness direction of the mobile terminal 100 while allowing the movement thereof only in the first direction or the second direction.

Figure 11:
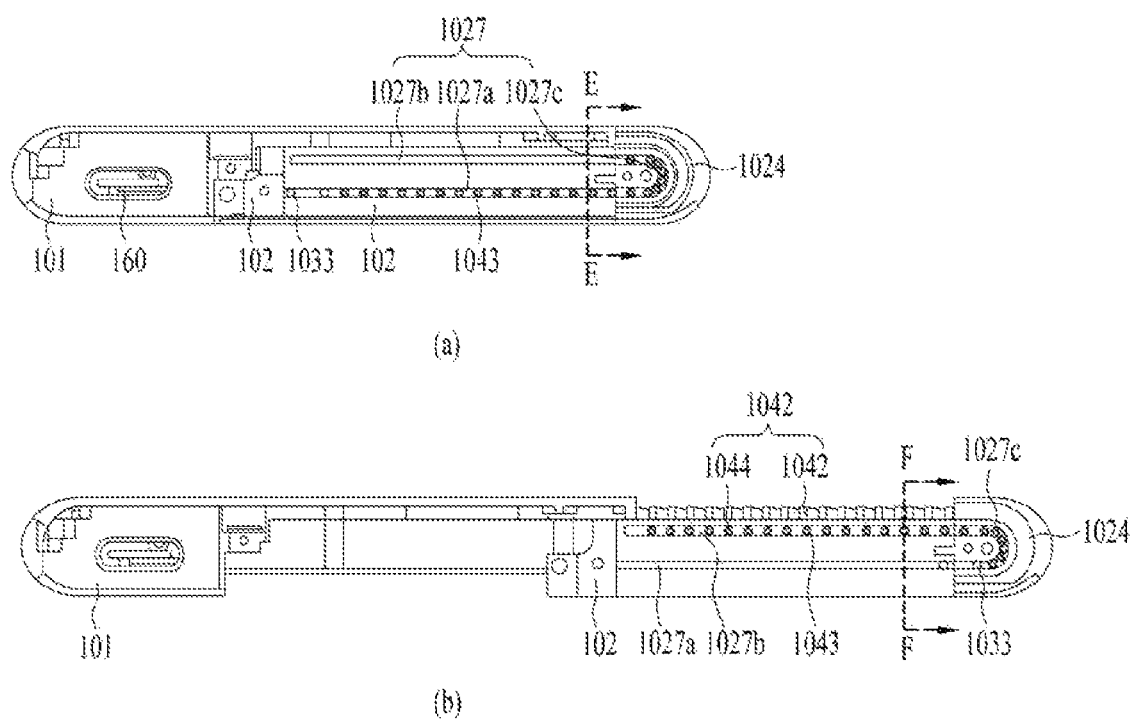
FIG. 11 is a cross-sectional view taken along lines C-C and D-D in FIG. 2.
Figure 12:
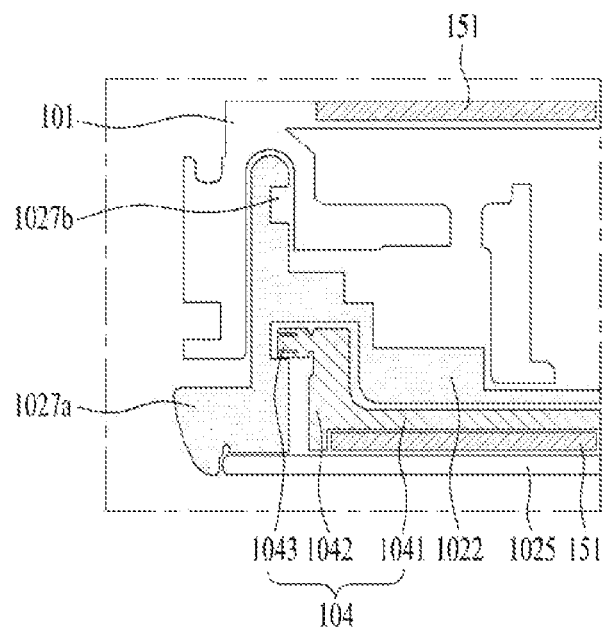
FIG. 12 is a cross-sectional view taken along lines E-E and F-F in FIG. 10.
Figure 12:
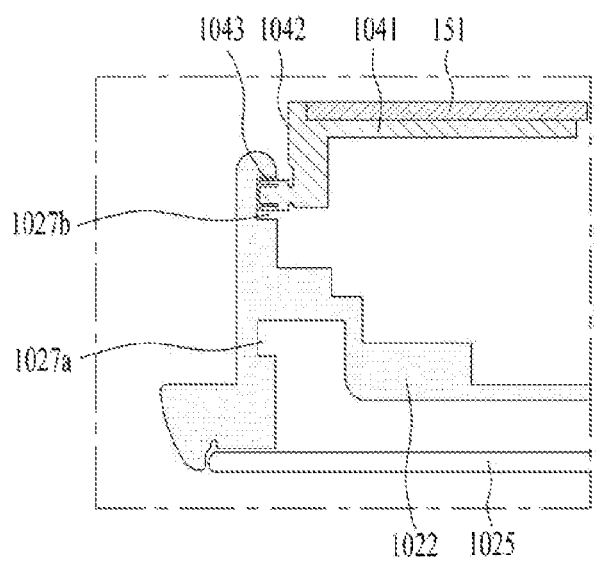
Figure 13:
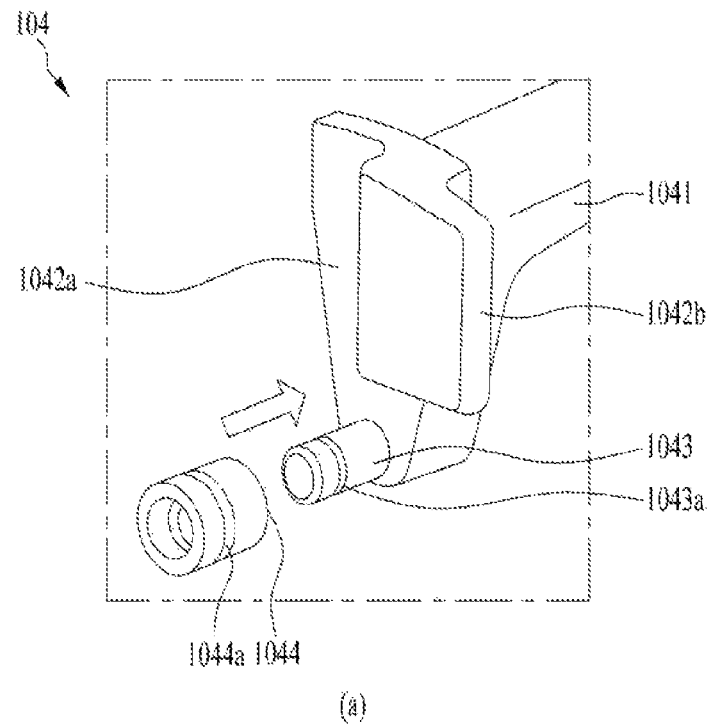
FIG. 13 is a view showing an expanded side portion and a guide hook of the mobile terminal in accordance with an embodiment.
Figure 13:
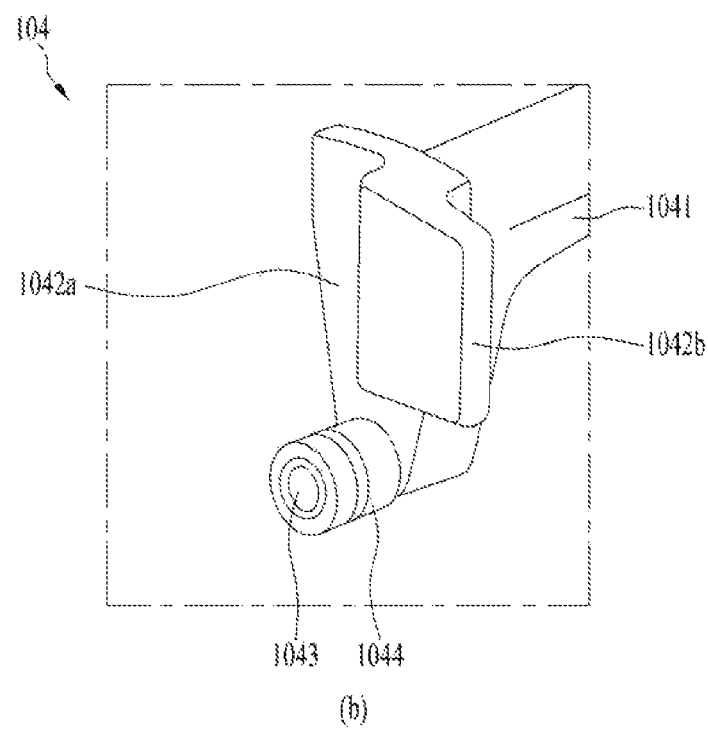

FIGS. 11 to 13 are views showing the slide structures 1043 and 1027 provided on the rolling plate 104 and the second frame 102. FIG. 11 is a cross-sectional view taken along lines C-C and D-D in FIG. 2, FIG. 12 is a cross-sectional view taken along lines E-E and F-F in FIG. 10, and FIG. 13 is a view showing an expanded side portion 1042 and a guide hook 1043 of the mobile terminal 100 in accordance with an embodiment.

As shown in FIG. 13, the rolling plate 104 may include a slide hook 1043 protruding toward the second side portion 1023 positioned on the side of the second frame 102 facing in the third direction. As shown in FIG. 11, the second side portion 1023 of the second frame 102 may include a slide rail 1027 into which the slide hook 1043 is movably inserted. FIG. 11 shows the slide rail 1027 formed on the second side portion 1023 of the second frame 102. The slide rail 1027 may include a pair of horizontal portions 1027*a* and 1027*b* arranged side by side in a thickness direction and a curved portion 1027*c* connecting ends of the horizontal portions 1027*a* and 1027*b* facing in the first direction. The pair of horizontal portions 1027*a* and 1027*b* and the curved portion 1027*c* may form a U shape, and the slide hook 1043 may move along the slide rail 1027.

In the first state, the slide hook 1043 may be positioned in the horizontal portion 1027*a*, 1027*b* positioned on the rear side, as shown in FIG. 11(*a*). In the second state, the slide hook 1043 may be moved to the horizontal portion 1027*a*, 1027*b* positioned on the front side, as shown in FIG. 11(*b*). When moved from the rear horizontal portion 1027*a*, 1027*b* to the front horizontal portion 1027*a*, 1027*b*, the slide hook 1043 may pass through the curved portion 1027*c*. When the slide hooks 1043 pass through the curved portion 1027*c*, the rolling plate 104 may be bent and the space between the slide hooks 1043 may be narrowed.

The slide rail 1041 along which the slide hook 1043 moves may guide the movement of the slide hook 1043 and the movement of the slide frame 103 simultaneously. Since the slide frame 103 is also disposed adjacent to the support bars, a slide hook 1033 protruding from the slide frame 103 may be further provided.

FIG. 12(*a*) shows the second frame 102 in the first state in which the first frame 101 and the second frame 102 overlap each other, and FIG. 12(*b*) shows the second frame 102 moved from the first frame 101 in the first direction in the second state. As shown in FIG. 12(*a*), the support bars 1041 and the slide hooks 1043 are positioned on the rear in the first state. In the second state, as shown in FIG. 12(*b*), the support bars 1041 and the slide hooks 1043 are positioned on the front. The distance from the front face of the display unit 151 to the front horizontal portions 1027*a* and 1027*b* may be equal to the distance from the rear face of the display unit 151 to the rear horizontal portions 1027*a* and 1027*b*.

When large friction occurs during movement of the slide hooks 1043 along the slide rail 1027, a large load may be applied to the driving unit 200, thereby generating frictional noise or affecting the durability of the product. A self-lubricating member having high abrasion resistance and low friction resistance, such as polyoxymethylene (POM), may be used to facilitate the movement of the slide hooks 1043 on the slide rail 1027. By forming the slide hooks 1043 in a cylindrical shape, the area thereof in contact with the slide rail 1027 may be minimized.

As illustrated in FIG. 13, a slide roller 1044 fitted onto the slide hook 1043 may be further provided. The slide roller 1044 may be fitted onto the cylindrical slide hook 1043 to rotate about an axis extending in a direction in which the slide hook 1043 protrudes. The slide roller 1044 may rotate when the slide hook 1043 moves along the slide rail 1027, thereby reducing friction generated between the slide roller 1044 and the slide rail 1027.

A bearing structure may help to reduce the friction, but it may increase the overall size. For this reason, a simple ring-shaped slide roller 1044 may be used. A fastening groove 1043a and a fastening protrusion 1044a may be further provided to prevent the slide roller 1044 from being separated from the slide hook 1043. When the fastening protrusion 1044a is inserted into the fastening groove 1043a, the fastening groove 1043a formed on the outer circumferential surface of the slide hook 1043 in a ring shape and the ring-shaped fastening protrusion 1044a protruding from the inner surface of the slide roller 1044 are fastened to each other.

The second side portion 1023 of the second frame 102 is disposed overlapping the first side portion 1013 of the first frame 101 in the first state, and is exposed to the outside in the second state. Since the second side portion 1023 is positioned inside the first side portion 1013 of the first frame 101 in the first state, it may be difficult to connect the interface unit 160, the user input unit 123, the audio output unit 152, the antenna, and the like, which are positioned on the first side portion 1013, to the printed circuit board 181, which is positioned inside.

The second side portion 1023 may include an opening 1023a formed by omitting at least a part of the second side portion 1023 to connect the components positioned on the first side portion 1013 to the printed circuit board 181 positioned inside the first frame 101. Through the opening 1023a, a connector may be arranged between the components positioned on the first side portion 1013 and the printed circuit board. The opening 1023a may have a shape elongated in the first direction to prevent interference between the connector and the second side portion 1023 of the second frame 102 even when the second frame 102 is moved.

Figure 14:
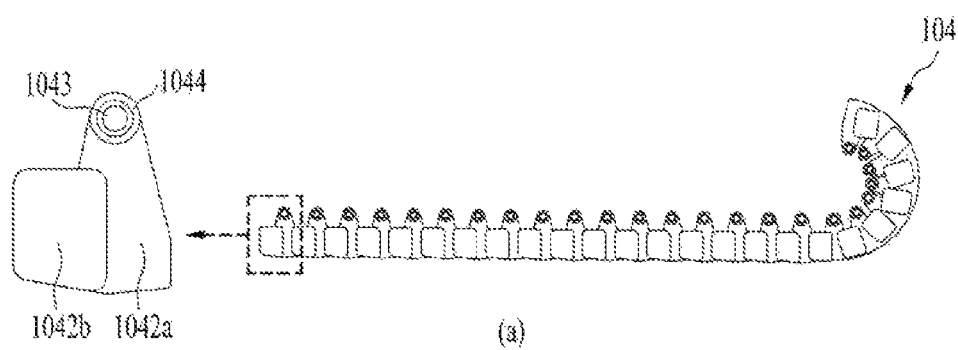
FIG. 14 is a view showing an embodiment of a rolling plate of the mobile terminal.
Figure 14:
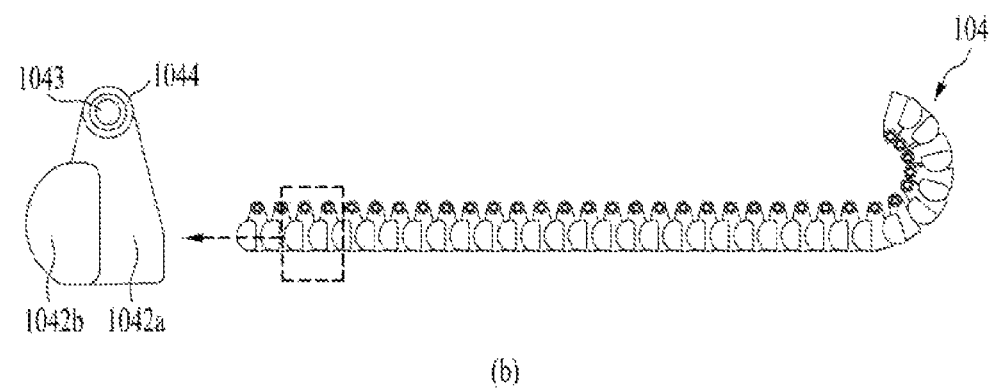

However, in order to prevent the inside of the mobile terminal 100 from being exposed through the opening 1023a in the second state, an expanded side portion 1042 may be formed at an end of the support bar 1041 to cover the opening 1023a in the second state. The expanded side portion 1042 may have a larger area than the cross section of the support bar 1041 at the end of the support bar 1041. The slide hook 1043 may be formed on a first expanded side portion 1042a extending in a direction away from the display unit 151. When the slide hook 1043 is disposed parallel to the support bar 1041, the second side portion 1023 of the second frame 102 should be extended adjacent to the display unit 151, which may make it difficult to form the opening 1023a. Accordingly, the slide hooks 1043 may be formed at positions spaced apart from the display unit 151 by a predetermined distance. The first expanded side portion 1042a may be formed in a fan shape to have a width that is reduced as the first expanded side portion 1042a extends in a direction away from the display unit 151. FIG. 14 is a view showing an embodiment of the rolling plate 104 of the mobile terminal 100. Since the rolling plates at positions on the curved portion 1027c of the slide rail 1027 spaced apart from the display portion 151 are disposed adjacent to each other, the first expanded side portion 1042a may be formed in a fan shape to prevent the rolling plates from overlapping each other.

The expanded side portion 1042 may also extend in the left-right direction, and may thus cover a space between neighboring support bars 1041. The expanded side portion 1042 may further include a second expanded side portion 1042b forming a step with respect to the first expanded side portion 1042a as shown in FIG. 13. The second extension side portion 1042b may be disposed to overlap the first expanded side portion 1042a adjacent thereto to cover the space between the support bars 1041. The second expanded side portion 1042b may have a size corresponding to the thickness-wise size of the opening 1023a formed in the second side portion 1023 of the second frame 102. The second expanded side portion 1042b may be formed to be shorter than the first expanded side portion 1042a on the side spaced apart from the display unit 151. The second expanded side portion 1042b may be formed to be shorter than the first expanded side portion 1042a to prevent the second expanded side portions 1042b from overlapping each other when the rolling plates pass through the curved portion 1027c of the slide rail 1027. The second expanded side portion 1042b may be formed to have a size corresponding to the size of the opening 1023a to cover the space between the first expanded side portions 1042a to prevent the inside of the second frame 102 from being exposed to the outside.

As shown in FIG. 14, the second expanded side portion 1042b may have any shape as long as the shape ensures that the second expanded side portions 1042b do not interfere with each other, and allows the second expanded side portion 1042b to cover the space between the first expanded side portions 1042a and to cover the opening 1023a of the second side portion 1023 of the second frame 102. It may have a rectangular shape as shown in FIG. 14(a) or a semicircular shape as shown in FIG. 14(b).

Figure 15:
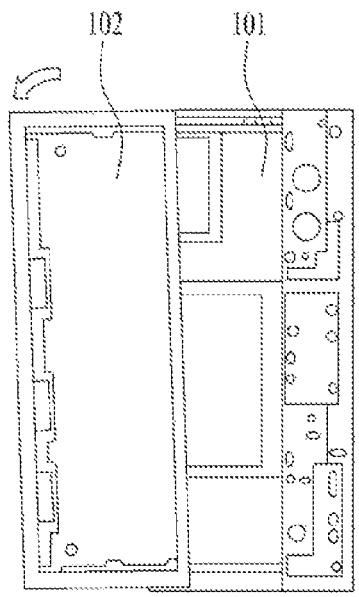
FIG. 15 is a view illustrating an issue of distortion and shaking of a first frame and a second frame of the mobile terminal.
Figure 15:
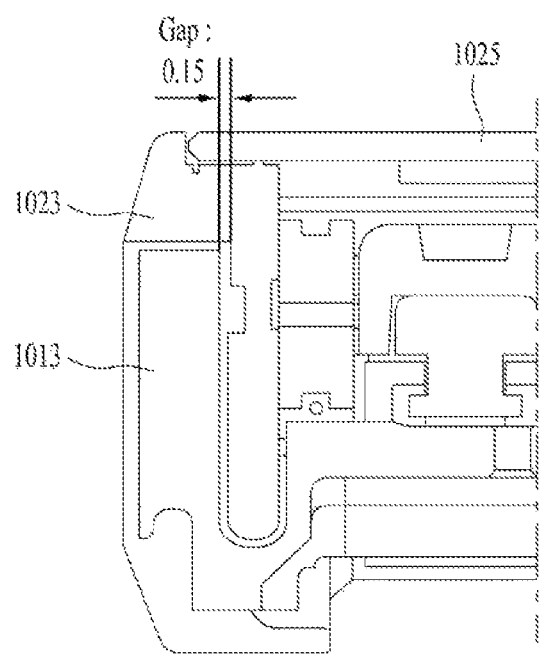

FIG. 15 is a view showing a state in which the first frame 101 and the second frame 102 of the mobile terminal 100 are distorted and shaken. As shown in FIG. 15(a), the first frame 101 and the second frame 102 may be distorted and dislocated in a longitudinal direction (up and down direction) of the mobile terminal 100 when the first frame 101 and the second frame 102 slidably move. Due to such distortion, wrinkles may occur on the display unit 151 or a slide structure may be damaged.

As shown in FIG. 15(b), the first frame 101 and the second frame 102 require a predetermined gap for slide movement. If the first frame 101 and the second frame 102 are in close contact, sliding movement may not be performed due to increased friction. The first frame 101 and the second frame may have a gap of about 0.15 mm. However, such a gap may become a cause of distortion as shown in FIG. 15(a). Accordingly, a member capable of causing the second frame 102 to horizontally move without shaking while maintaining the gap is needed.

Figure 16:
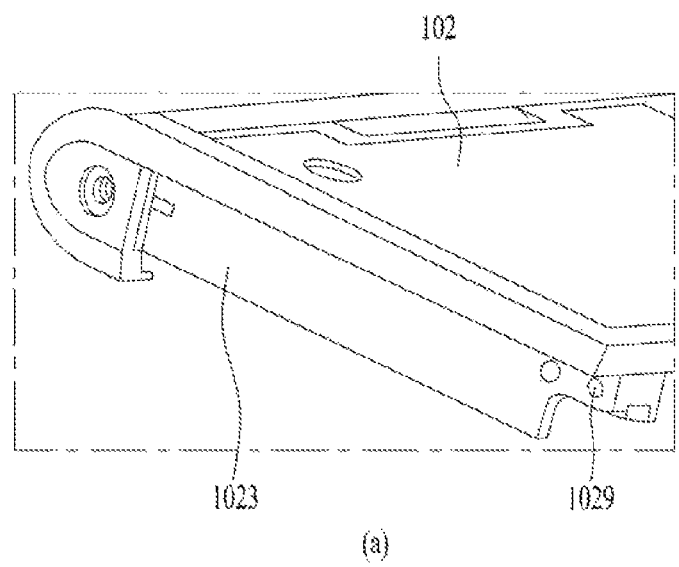
FIG. 16 is a view showing the mobile terminal to which a rolling ball is applied.
Figure 16:
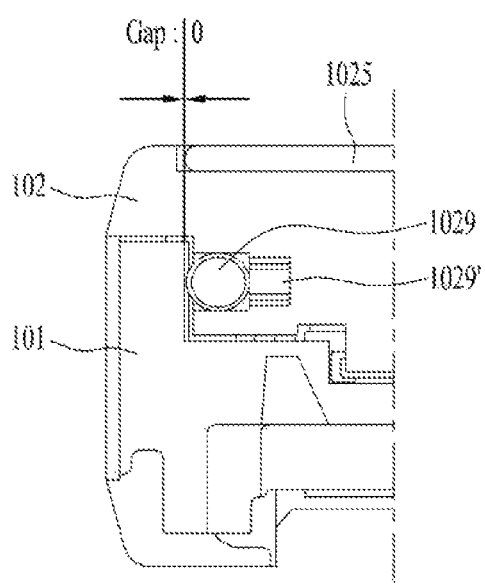

FIG. 16 is a view showing a rolling ball 1029 for solving the problem of FIG. 15. As shown in FIG. 16(a), the rolling ball 1029 is inserted into a concave inserter formed at the second side portion 1023 of the second frame 102. One side of the rolling ball 1029 contacts the first frame 101 and may rotate within the inserter of the second side portion 1023 when the second frame 102 moves in the first direction. When the rolling ball 1029 is rotatably inserted, since there is no structure in which rolling ball 1029 is fixed to the second frame 102, the rolling ball 1029 is separated during an assembly process, thereby making it difficult to assemble the rolling ball 1029. In order to solve this problem, as shown in FIG. 16(b), a magnet 1029' is disposed inside the inserter and the rolling ball 1029 is made of a magnetic material, so that the first frame 101 and the second frame 102 may be prevented from being separated from the inserter during assembly.

The rolling ball 1029 protrudes as much as the gap between the first frame 101 and the second frame 102 and contacts the first frame 101, so that the second frame 102 is prevented from being distorted due to the gap and the second frame 102 is separated from the first frame by a predetermined gap without direct contact between the first frame 101 and the second frame 102. In addition, since the rolling ball 1029 rotates when the second frame 102 moves, friction occurring when the state of the mobile terminal is changed may be minimized.

As described above, the mobile terminal of the present disclosure may adjust the size of a screen when necessary, thereby satisfying both portability and usability.

The mobile terminal of the present disclosure may reduce damage caused by concentration of stress on the display unit because stress is not concentrated at a specific point.

In addition, the display unit of a flat state may be maintained by preventing the display unit from being lifted when the second frame moves.

The mobile terminal includes a structure for guiding the second frame 102 and the slide frame 103 to move in parallel during movement, thereby preventing distortion.

The above detailed description is to be construed in all aspects as illustrative and not restrictive. The scope of the present disclosure should be determined by reasonable interpretation of the appended claims and all changes coming within the equivalency range of the present disclosure are intended to be included in the scope of the present disclosure.

Figure 17:
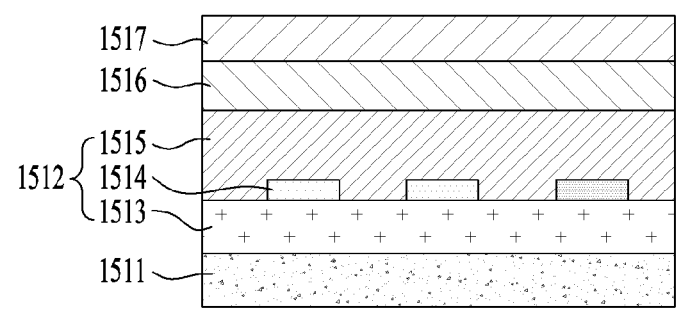
FIG. 17 is a conceptual view illustrating a stacked structure of a display panel having flexibility

FIG. 17 is a conceptual view illustrating a stacked structure of the display panel 151 having flexibility.

The mobile terminal may include the display panel 151 having flexibility. The display panel 151 may use a flexible material for each layer constituting the display panel 151 in order to secure flexibility.

The display panel 151 may include a base substrate 1511, a light-emitting layer 1512 provided on the base substrate 1511, a polarizing film 1516 stacked on the light-emitting layer 1512, and a protective film 1517 stacked on the polarizing film 1516.

The base substrate 1511 is a substrate supporting the display panel 151 and a glass substrate has conventionally been used. However, in order to secure flexibility of the display panel 151, a polyimide (PI) substrate has recently been used. PI is a kind of plastic material that is flexible and resistant to heat, so that PI may be suitable for stacking a thin-film transistor (TFT) and an organic material thereon like glass.

The light-emitting layer 1512 is a layer that generates an image and may include a TFT film 1513, a light-emitting element 1514, and an encapsulation layer 1515.

The TFT film 1513 may include a TFT and circuit wiring that provide an electric signal to the light-emitting element 1514.

The light-emitting device 1514 may be provided on the TFT film 1513 to convert an electric signal applied from the TFT into an optical signal. Specifically, the light-emitting element 1514 may include a light-emitting device (LED).

The encapsulation layer 1515 may be a layer that seals the light-emitting element 1514 to protect the light-emitting element 1514 from external moisture and air. The encapsulation layer 1515 may be formed by alternately stacking an organic layer and an inorganic layer to implement flexibility. The inorganic layer may be used to prevent infiltration of external moisture and air. However, since the inorganic layer includes a weak portion called a pinhole, several overlapping inorganic layers may be provided and an organic layer having high formability may be stacked between the inorganic layers.

The polarizing film 1516 may be stacked on the light-emitting layer 1512. The polarizing film 1516 may serve to prevent reflection of external light.

The protective film 1517 may be stacked on the polarizing film 1516. The protective film 1517 may function to protect the light-emitting element 1514 from external impact. Conventionally, a glass substrate has been used as the protective film 1517. The glass substrate is suitable for protecting a display because the glass substrate has transparency and high strength. However, a foldable phone or a rollable phone that folds or rolls the display has recently used a colorless transparent polyimide (CPI) film, instead of the glass substrate, as an alternative to glass. The CPI film has excellent mechanical, electrical and chemical properties compared to other materials and has the advantage of being highly resistant to external impact and being light and flexible.

The protective film 1517 may include a plurality of layers. The protective film 1517 may include a polyethylene terephthalate (PET) film and a hard coating (HC) film in addition to the CPI film. Additionally, the protective film 1517 may include an anti-fingerprint (AF) film.

The display panel 151 of FIG. 17 has a structure of a basic display panel having flexibility and additional films such as a touch film and a phase latency film may be provided on each layer. Specifically, the additional films may be provided between the protective film 1517 and the polarizing film 1516 or between the polarizing film 1516 and the light-emitting layer 1512. In addition, an optically clear adhesive (OCA) film for adhesion may be included between layers.

The display panel 151 having flexibility may be suitable for a mobile terminal in which a shape thereof is not fixed and therefore a display screen is not fixed. However, since the display panel 151 having flexibility is not fixed in shape, there may be a problem in that the display panel 151 surrounds a curved edge. Hereinafter, a problem in which the display panel 151 is lifted in a curved edge region will be described.

Figure 18:
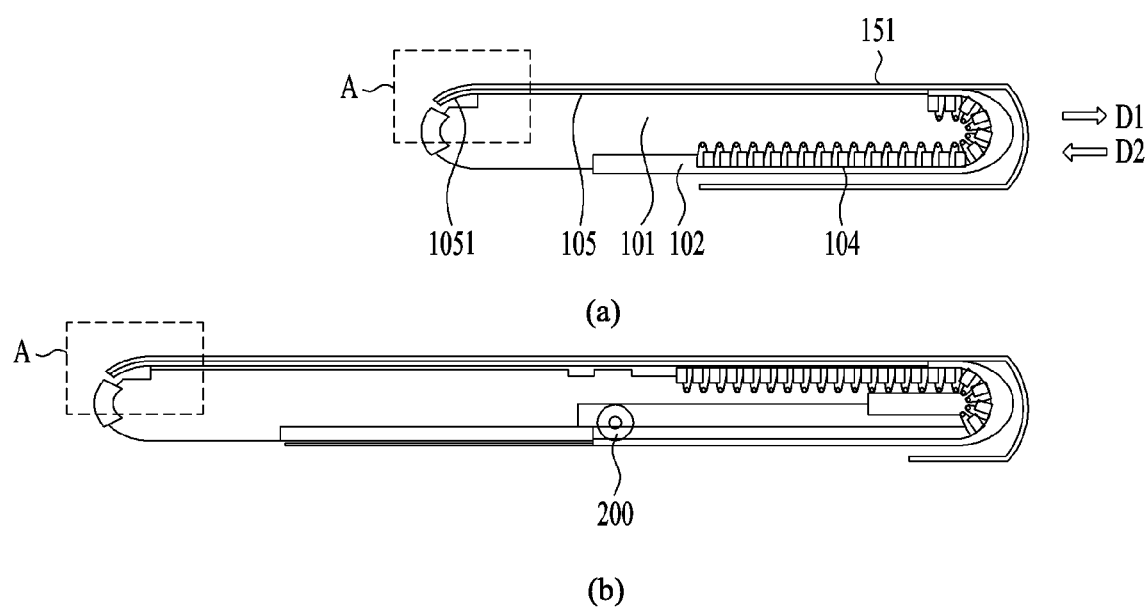
FIG. 18 is a cross-sectional view illustrating a curved edge of the mobile terminal.

FIG. 18 is a cross-sectional view illustrating a curved edge of a mobile terminal. For the stacked structure of the display 151, reference is made to FIG. 17.

The mobile terminal according to an embodiment may include the display panel 151 having flexibility and a support plate 105 that supports the display panel 151 and includes a curved edge 1051, at least a part of which is surrounded by the display panel 151.

Specifically, the mobile terminal according to an embodiment may include the first frame 101, the second frame 102 that slidably moves in the first direction D1 or in the second direction D2, which is a reverse direction of the first direction from the first frame 101, the driving unit 200 for causing the second frame 10 to slidably move, the display panel 151 having flexibility provided to surround the front face of the first frame 101 and the second frame 102 that slidably moves, and the support plate 1051 that is provided on the front face of the first frame to support the display panel 151 and includes the curved edge 1051, at least a part of which is surrounded by the display panel 151.

Specifically, FIG. 18(a) shows a state in which the second frame 102 has moved in the second direction D2 based on the first frame 101, and FIG. 18(b) is a state in which the second frame 102 has moved in the first direction D1 based on the first frame 101. In some cases, FIG. 18(*a*) may refer to a first state of the mobile terminal and FIG. 18(*b*) may refer to a second state of the mobile terminal.

The display panel 151 of the mobile terminal may output a narrow screen to the front in the first state and may output a wide screen to the front in the second state.

In the display panel 151, a portion surrounding the second frame 102 may be formed of a curved surface. In correspondence thereto, the support plate 105 may include the curved edge 1051 at the upper portion in the second direction D2. The curved edge 1051 may have an edge bent in a rear direction and form a preset radius of curvature. The radius of curvature of the curved edge 1051 may correspond to a radius of curvature formed by surrounding the second frame 102 by the display panel 151.

Since the display panel 151 has flexibility and does not include a substrate that fixes the shape thereof, there may be a problem in that the display panel 151 is lifted at the curved edge 1051.

Figure 19:
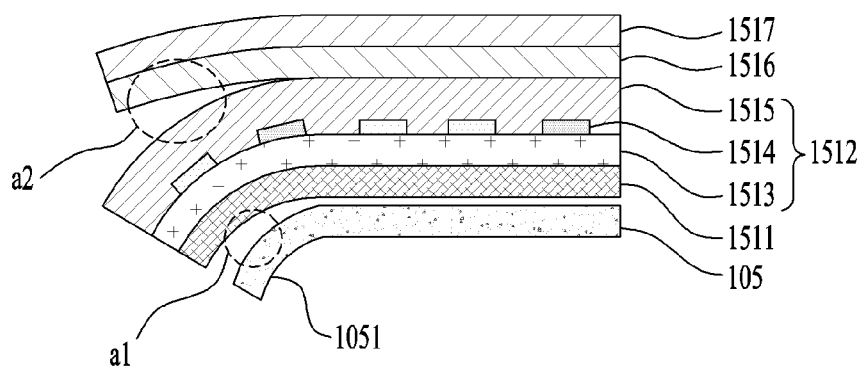
FIGS. 19 and 20 are view illustrating a problem occurring at a curved edge of the display panel.
Figure 20:
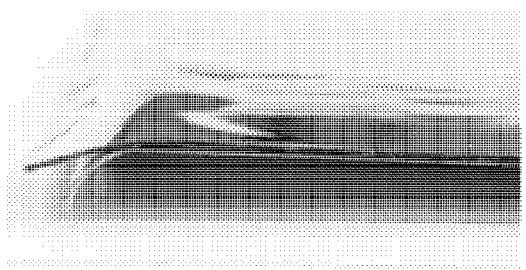
Figure 20:
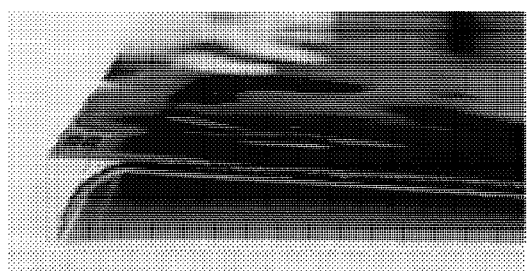

FIGS. 19 and 20 are views illustrating a problem occurring at a curved edge of the display panel. Specifically, FIG. 19 is an enlarged view of part A of FIG. 18, and FIG. 20 is a view showing an actual problem viewed through a picture.

The display panel 151 includes a plurality of layers 1511, 1512, 1516, and 1517, and each layer may have flexibility. Each layer having flexibility may have elasticity to maintain the shape thereof and this elasticity may cause a problem of lifting the display panel 151 at the curved edge 1051.

Specifically, the display panel 151 may be problematic in that the base substrate 1511 in contact with the curved edge 1051 of the support plate 105 is separated (see a1 of FIG. 19). The problem in which the base substrate 1511 is separated may occur as elasticity of each layer of the display panel 151 is combined.

In addition, the display panel 151 may be problematic in that the light-emitting layer 1512 is separated from the polarizing film 1516 in an area surrounding the curved edge 1051 of the support plate 105 (see a2 of FIG. 19). The problem in which the light-emitting layer 1512 is separated from the polarizing film 1516 may occur due to a difference in adhesive force between the layers of the display panel 151.

Referring to the picture, FIG. 20(*a*) shows a result of photographing a separated shape of a1 of the display panel 151 and FIG. 20(*b*) shows a result of photographing a separated shape of a2 of the display panel 151.

In order to solve the problem in which the display panel 151 is lifted at the curved edge 1051, each layer of the display panel 151 may have a different length extended from an end portion thereof. Hereinafter, a stacked structure of end portions of the display panel 151 will be described in detail.

Figure 21:
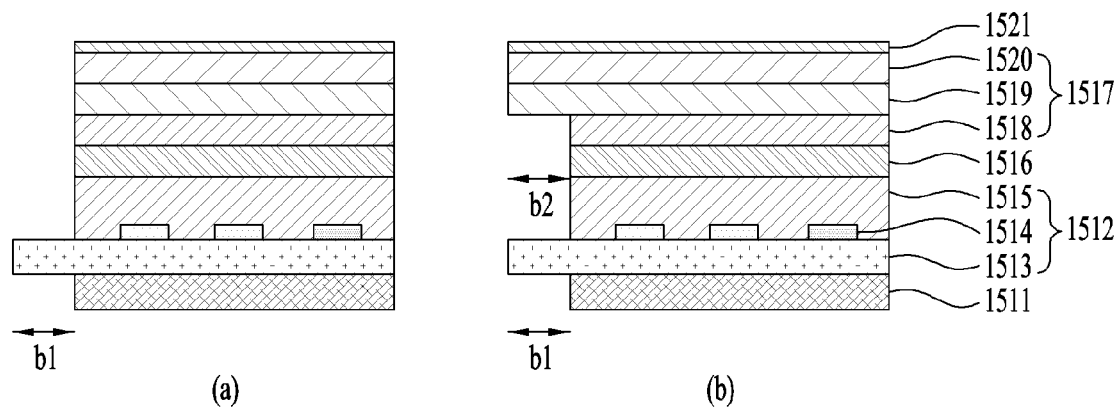
FIG. 21 is a conceptual diagram illustrating a stacked structure for solving the problem occurring at the curved edge of the display panel.

FIG. 21 is a conceptual diagram illustrating a stacked structure for solving the problem occurring at the curved edge of the display panel. Specifically, FIG. 21(*a*) illustrates a stacked structure of the display panel 151 to prevent a1 from being separated at the curved edge 1051. FIG. 21(*b*) illustrates a stacked structure of the display panel 151 to prevent a1 and a2 from being separated at the curved edge 1051.

Referring to FIG. 21(*a*), the display panel 151 may include the base substrate 1511, the light-emitting layer 1512 provided on the base substrate 1511, the polarizing film 1516 provided on the light-emitting layer 1512, and the protective film 1517 provided on the polarizing film 1516. The light-emitting layer 1512 may include the TFT film 1513, the light-emitting element 1514 that emits light according to a signal provided by the TFT film 1513, and the encapsulation layer 1515 that seals the light-emitting element 1514. The TFT film 1513 may be provided to be extended from the base substrate 1511 in an area surrounding the curved edge 1051.

Specifically, the TFT film 1513 may be extended by length b1 from the base substrate 1511 in a direction surrounding the curved edge 1051.

Referring to FIG. 21(*b*), the display panel 151 may include the base substrate 1511, the light-emitting layer 1512 provided on the base substrate 1511, the polarizing film 1516 provided on the light-emitting layer 1512, and the protective film 1517 stacked on the polarizing film 1516. The protective film 1517 may be extended along a curvature direction of the curved edge 1051 to cover the edge of the polarizing film 1516.

Specifically, the protective film 1517 may be extended by length b2 from the polarizing film 1516 in a direction surrounding the curved edge 1051. In some cases, only the protective film 1517 may be extended or the TFT film 1513 may also be extended by length b1 from the base substrate 1511 in a direction surrounding the curved edge 10585.

The protective film 1517 may include a plurality of layers and upper layers among the plural layers constituting the protective film 1517 may be extended by length b2 from the polarizing film 1516 in a direction surrounding the curved edge 1051.

Specifically, the protective film 1517 may be configured by stacking a CPI film 1518, a PET film 1519, and an HC film 1520. In this case, the PET film 1519 and the HC film 1520 of the protective film 1517 may be extended in a curvature direction of the curved edge to cover the edge of the polarizing film 1516.

Additionally, the display panel 151 may further include an AF film 1521 stacked along the upper face of the protective film 1517, specifically, on the upper face of the HC film 1520. The AF film 1521 may be extended from the polarizing film 1516 along the upper face of the extended HC film 1520.

Figure 22:
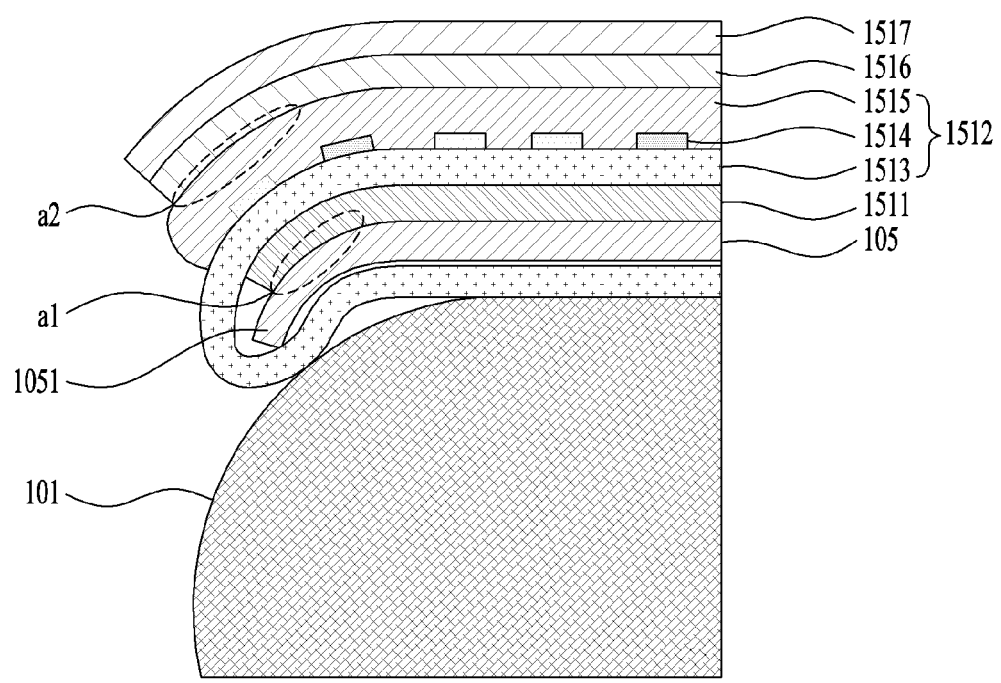
FIGS. 22 and 23 are conceptual views illustrating a stacked structure of the display panel at the curved edge.
Figure 23:
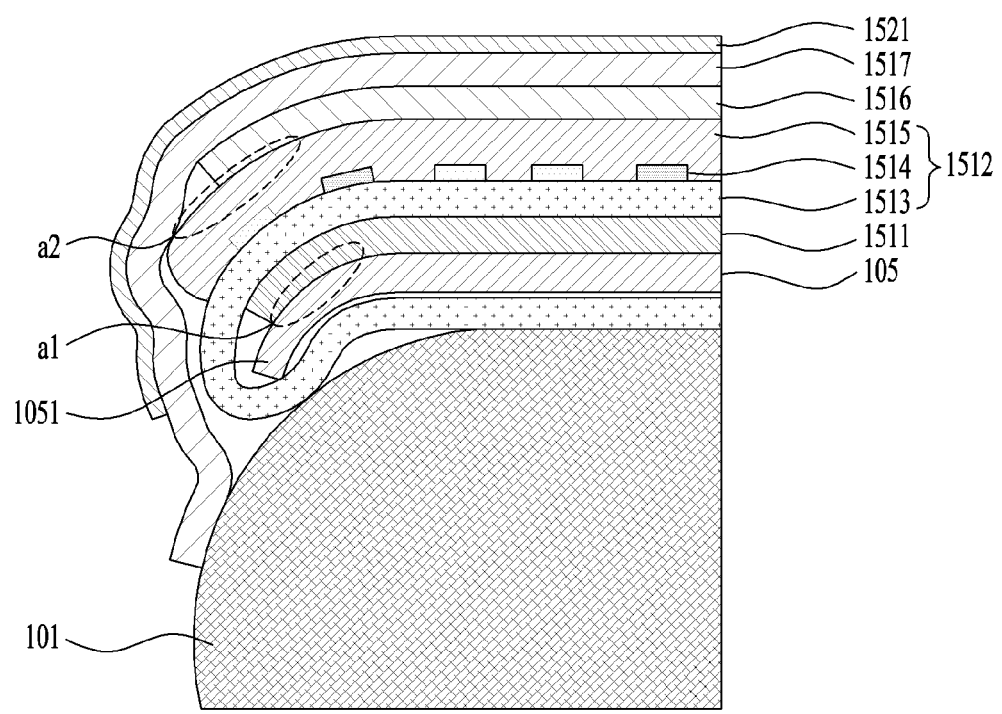

FIGS. 22 and 23 are conceptual views illustrating a stacked structure of the display panel at the curved edge. Specifically, FIG. 22 is a stacked structure corresponding to FIG. 21(*a*), and FIG. 23 is a stacked structure corresponding to FIG. 21(*b*).

Referring to FIG. 22, the display panel 151 may include the base substrate 1511, the light-emitting layer 1512 provided on the base substrate 1511, the polarizing film 1516 provided on the light-emitting layer 1512, and the protective film 1517 provided on the polarizing film 1516. The light-emitting layer 1512 may include the TFT film 1513, the light-emitting element 1514 that emits light according to a signal provided by the TFT film 1513, and the thin-film encapsulation layer 1515 that seals the light-emitting element 1514. The TFT film 1513 may be provided to be extended from the base substrate 1511 in an area surrounding the curved edge 1513.

The TFT film 1513 may be extended from the front face of the curved edge 1051 to the rear face of the curved edge 1051 so as to surround the curved edge 1051. The base substrate 1511 has a structure that is completely surrounded by the TFT film 1513 in a region of the curved edge 1051, thereby preventing the support plate 105 from being separated therefrom.

Specifically, the TFT film 1513 is extended from the front face to the rear face of the curved edge 1051 so as to surround the curved edge 1051 and may be coupled to an electronic control unit (not shown) provided inside the first frame 101. Here, the electronic control unit (not shown) may be a controller that controls an image output through the display panel 151.

The TFT film 1513 is provided to surround the base substrate 1511 in the display panel 151, thereby preventing a1 of the display panel 151 from being separated.

In addition, the TFT film 1513 may have a structure extended from the base substrate 1511 to reduce repulsive force to be unfolded, thereby preventing the repulsive force to be unfolded from being transferred to the polarizing film 1516 stacked thereon. That is, the TFT film 1513 may prevent a2 of the display panel 151 from being separated.

However, when adhesive force between the polarizing film 1516 and the light-emitting layer 1512 is less than the repulsive force to be unfolded, a2 of the display panel 151 may be separated. As a structure for preventing this, reference may be made to FIG. 23.

Referring to FIG. 23, the display panel 151 may include the base substrate 1511, the light-emitting layer 1512 provided on the base substrate 1511, the polarizing film 1516 provided on the light-emitting layer 1512, and the protective film 1517 stacked on the polarizing film 1516. The protective film 1517 may be extended in a curvature direction of the curved edge 1051 to cover the edge of the polarizing film 1516.

Specifically, the protective film 1517 may be extended from the polarizing film 1516 in a direction of surrounding the curved edge 1051. In some cases, only the protective film 1517 may be extended or the TFT film 1513 may also be extended from the base substrate 1511 in a direction surrounding the curved edge 10585.

The protective film 1517 may include a plurality of layers and upper layers among the plural layers constituting the protective film 1517 may be extended from the polarizing film 1516 in a direction surrounding the curved edge 1051.

Specifically, the protective film 1517 may be extended in a curvature direction of the curved edge 1051 to cover the edge of the TFT film 1513. That is, the protective film 1517 may be extended in a curvature direction of the curved edge 1051 so as to simultaneously cover the polarizing film 1516 and the TFT film 1513.

The protective film 1517 may be extended in the curvature direction of the curved edge 1051 to offset repulsive force by which the polarizing film 1516 is unfolded. Specifically, a2 of the display panel 151 is separated when adhesive force between the polarizing film 1516 and the light-emitting layer 1512 is less than repulsive force by which the polarizing film 1516 and the protective film 1517 are unfolded. a2 of the display panel 151 may be prevented from being separated by reducing the repulsive force by which the protective film 1517 is unfolded.

In addition, the display panel 151 may further include the AF film 1521 stacked along the upper face of the protective film 1517, specifically, along the upper face of the HC film 1520. The AF film 1521 may be extended from the polarizing film 1516 along the upper face of the extended protective film 1517.

Figure 24:
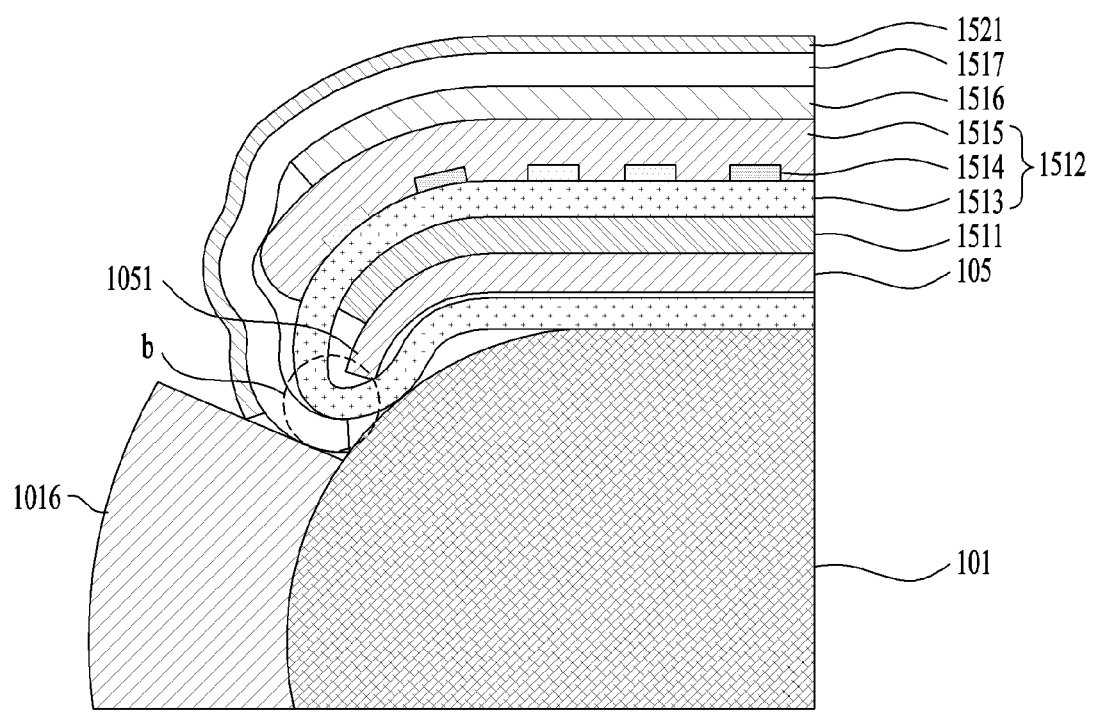
FIG. 24 is a view illustrating a coupling structure of a side frame to prevent the display panel from being lifted at the curved edge.

FIG. 24 is a view illustrating a coupling structure of a side frame to prevent the display panel from being lifted at the curved edge.

The mobile terminal according to an embodiment may include the display panel 151 having flexibility and the curved edge 1051 that supports the display panel 151 and includes the curved edge 1051, at least a part of which is surrounded by the display panel 151. The display panel 151 includes the base substrate 1511, the light-emitting layer 1512 provided on the base substrate 1511, the polarizing film 1516 provided on the light-emitting layer 1512, and the protective film 1517 provided on the polarizing film 1516. The protective film 1517 may be extended in the curvature direction of the curved edge 1051 so as to surround the polarizing film 1516.

The mobile terminal may further include the main frame 101 having a front face at which the support plate 105 is located and a side frame 1016 that surrounds the side face of the main frame 101 and contacts the curved edge 1051 of the support plate 105. Here, the main frame 101 may correspond to the first frame 101. The side frame 1016 and the curved edge 1051 may face each other with a region separated by a predetermined interval (see b in FIG. 24).

The protective film 1517 may be extended in the curvature direction of the curved edge 1051 so that an end portion thereof may be provided (in region b) between the support plate 105 and the side frame 1016. In some cases, the extended end portion of the protective film 1017 may be provided between the side frame 1016 and the main frame 101.

The light-emitting layer 1512 may include the TFT film 1513, the light-emitting element 1514 provided on the TFT film 1513 to emit light according to a signal provided by the TFT film 1513, and the encapsulation layer 1515 that seals the light-emitting element 1514. The TFT film 1513 may be extended in the curvature direction of the curved edge 1051 so as to surround the edge of the base substrate 1511.

In this case, the protective film 1517 may be extended in the curvature direction of the curved edge 1051 so as to surround the TFT film 1513 that surrounds the base substrate 1511.

Like the TFT film 1513, although the protective film 1517 may be extended from the front face to the rear face of the curved edge 1051 to surround the curved edge 1051, this may serve to separate the support plate 105 from the main frame 101, which may be undesirable.

Figure 25:
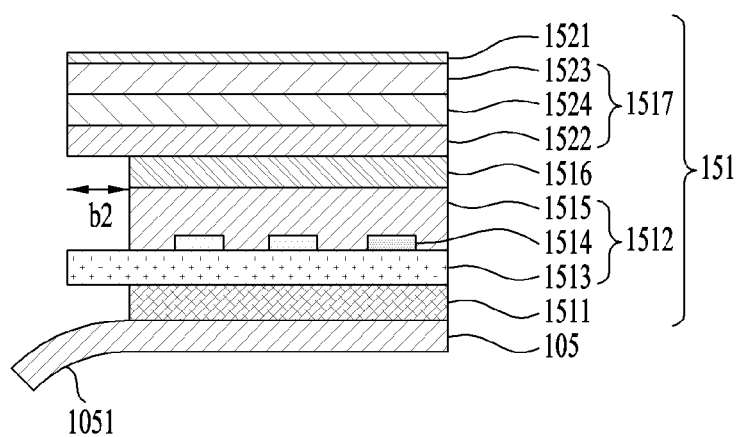
FIG. 25 is a conceptual diagram illustrating another stacked structure of the display panel.

FIG. 25 is a conceptual diagram illustrating another stacked structure of the display panel.

According to another embodiment, the mobile terminal may include the display panel 151 having flexibility and the support plate 105 supporting the display panel 151.

The display panel 151 may include the base substrate 1511, the light-emitting layer 1512 that is provided on the base substrate 1511 and includes the light-emitting element 1514, the thin-film encapsulation layer 1515 that seals the light-emitting element 1514, and the TFT film 1513 that applies a signal to the light-emitting element 1514, the polarizing film 1516 provided on the light-emitting layer 1512, and the protective film 1517 provided on the polarizing film 1516.

The protective film 1517 may include a ultra-thin glass (UTG) having flexibility. Specifically, the protective film 1517 may include a UTG 1524, a first HC film that coats the rear face of the UTG film 1524, and a second HC film 1523 that coats the front face of the UTG film 1524.

The protective film 1517 may have a feature of being reinforced against external force by using the UTG 1524 instead of the CPI film (1518, see FIG. 21). The rear face of the protective film 1517 as well as the front facer of the protective film 1517 may be coated with HC, so that scattering into the display panel may be prevented even when the UTG 1524 is damaged.

Even in this case, the support plate 105 may include the curved edge 1051, and the TFT film 1513 is extended in the curvature direction of the curved edge 1051 from the base substrate 1511 to surround the base substrate 1511 and to prevent the base substrate 1511 from being separated at the curved edge 1051.

In addition, the support plate 105 may include the curved edge 1051. The protective film 1517 may be extended in the curvature direction of the curved edge 1051 from the polarizing film 1516 to surround the polarizing film 1516, so that the polarizing film 1516 is prevented from being separated from the light-emitting layer 1512.

Additionally, the display panel 151 may include an AF film 1521 stacked on the protective film 1517. In this case, the AF film 1521 may be extended in the curvature direction of the curved edge 1051 on the extended protective film 1517 and provided to surround the polarizing film 1516 together with the protective film 1517.

According to the present disclosure, a display panel having flexibility may be prevented from being lifted due to elasticity of the display panel at a region surrounding a curved edge.

The above detailed description is to be construed in all aspects as illustrative and not restrictive. The scope of the disclosure should be determined by reasonable interpretation of the appended claims and all changes coming within the equivalency range of the disclosure are intended to be embraced in the scope of the disclosure.

What is claimed is:

1. A mobile terminal, comprising:
   a flexible display panel; and
   a support plate configured to support the flexible display panel, wherein the support plate comprises a curved edge, wherein at least a part of the curved edge is covered by the flexible display panel,
   wherein the flexible display panel comprises:
   a base substrate;
   a light-emitting layer provided on the base substrate and configured to comprise at least a light-emitting element, a thin-film encapsulation layer configured to seal the light-emitting element, and a thin-film transistor (TFT) film configured to supply a signal to the light-emitting element;
   a polarizing film provided on the light-emitting layer; and
   a protective film provided on the polarizing film, wherein the TFT film comprises a curved portion to curve around the curved edge of the support plate and an edge of the base substrate.

2. The mobile terminal of claim 1, wherein the curved portion of the TFT film extends from a front side of the curved edge.

3. The mobile terminal of claim 1, wherein the protective film extends in a curvature direction of the curved edge to cover an edge of the polarizing film.

4. The mobile terminal of claim 3, wherein the protective film covers the curved portion of the TFT film.

5. The mobile terminal of claim 3, wherein the protective film comprises stacking a colorless polyimide (CPI) film, a polyethylene terephthalate (PET) film, and a hard coating (HC) film.

6. The mobile terminal of claim 5, wherein the protective film extends in the curvature direction of the curved edge to cause the PET film and the HC film to cover an edge of the polarizing film.

7. The mobile terminal of claim 6, wherein the protective film further comprises an anti-fingerprint (AF) film overlapping an upper side of the HC film.

8. The mobile terminal of claim 3, further comprising:
   a main frame having a front side, wherein the support plate is located at the front side; and
   a side frame configured to curve around a side of the main frame and to contact the curved edge of the support plate.

9. The mobile terminal of claim 8, wherein the protective film comprises an extended end portion between the support plate and the main frame.

10. The mobile terminal of claim 1, wherein the protective film is formed by stacking a first HC film, an ultra-thin glass (UTG), and a second HC film.

11. A mobile terminal, comprising:
    a first frame;
    a second frame configured to slidably move with respect to the first frame in a first direction or in a second direction opposite to the first direction;
    a motor configured to cause the second frame to slidably move;
    a flexible display panel configured to curve around a front side of the first frame and the second frame; and
    a support plate provided at the front side of the first frame and configured to support the flexible display panel, wherein the support plate comprises a curved edge, wherein at least a part of the curved edge is covered by the flexible display panel,
    wherein the flexible display panel comprises:
    a base substrate;
    a light-emitting layer provided on the base substrate and configured to comprise a light-emitting element, a thin-film encapsulation layer configured to seal the light-emitting element, and a thin-film transistor (TFT) film configured to supply a signal to the light-emitting element;
    a polarizing film provided on the light-emitting layer; and
    a protective film provided on the polarizing film, wherein the TFT film comprises a curved portion to curve around the curved edge of the support plate and an edge of the base substrate.

12. The mobile terminal of claim 11, wherein the curved edge of the support plate is located at an end portion of the second direction.

13. The mobile terminal of claim 11, wherein the curved portion of TFT film extends from a front side of the curved edge to a rear side of the curved edge and the TFT film is coupled to a controller disposed inside the first frame.

14. The mobile terminal of claim 11, wherein the protective film extends in a curvature direction of the curved edge to cover an edge of the polarizing film.

15. The mobile terminal of claim 14, wherein the first frame further comprises a side frame configured to contact the curved edge of the support plate, and
    wherein the protective film comprises an extended end portion between the support plate and the side frame.

* * * * *